(12) United States Patent
Tsukuni et al.

(10) Patent No.: US 6,262,494 B1
(45) Date of Patent: Jul. 17, 2001

(54) BATTERY UNIT AND INFORMATION PROCESSING SYSTEM HAVING BATTERY UNIT MOUNTED THEREIN

(75) Inventors: Toshiaki Tsukuni; Yoshiro Takeda; Mitsuo Saeki; Hidekiyo Ozawa, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/221,116

(22) Filed: Dec. 28, 1998

(30) Foreign Application Priority Data

Mar. 20, 1998 (JP) .................................................. 10-072485

(51) Int. Cl.[7] ...................................................... H02H 3/00

(52) U.S. Cl. ............................. 307/80; 320/122; 324/434

(58) Field of Search ........................ 307/80, 64; 320/122; 324/434

(56) References Cited

U.S. PATENT DOCUMENTS

| | | | |
|---|---|---|---|
| 4,962,462 | * 10/1990 | Fekete | 364/492 |
| 5,546,003 | * 8/1996 | Noworolsli et al. | 324/434 |
| 5,894,212 | * 4/1999 | Balogh | 320/122 |

FOREIGN PATENT DOCUMENTS

| | | |
|---|---|---|
| 7-239372 | 9/1995 | (JP) . |
| 8-129436 | 5/1996 | (JP) . |

* cited by examiner

*Primary Examiner*—Josie Ballato
*Assistant Examiner*—Robert L. Deberadinis
(74) *Attorney, Agent, or Firm*—Armstrong, Westerman, Hattori, McLeland & Naughton, LLP

(57) ABSTRACT

A battery unit includes a plurality of cells connected in parallel with one another, and a switch connected in series with at least one of the cells. The battery unit further includes a control circuit for controlling the on or off state of the switch, and a voltage detection terminal at which a voltage produced by a cell, to which the switch is connected, is developed. The switch can be turned off even with the battery unit connected to a load. A cell in series with which the switch is connected is disconnected from the load. In this state, the state of the cell can be detected through the voltage detection terminal. Even when a resistor is substituted for the switch, the same advantage can be provided. Moreover, the battery unit is freely detachably attached to a main unit of an information processing apparatus. The battery unit then supplies power to the main unit. A power supply control circuit for requesting notification of the state of each cell in the battery unit is incorporated in the main unit. The states of the cells can therefore be detected mutually independently.

19 Claims, 19 Drawing Sheets

| A | B | G1 | G2 | k1 | k2 | CELL TO BE INSPECTED |
|---|---|----|----|-----|-----|----------------------|
| 0 | 0 | 0  | 0  | OFF | OFF | NONE                 |
| 0 | 1 | 1  | 0  | ON  | OFF | B1                   |
| 1 | 0 | 0  | 0  | OFF | OFF | NONE                 |
| 1 | 1 | 0  | 1  | OFF | ON  | B2                   |

| A | B | G1 | G2 | B1 | B2 |
|---|---|---|---|---|---|
| 0 | 0 | 0 | 0 | LOAD 11 | LOAD 11 |
| 0 | 1 | 1 | 0 | TERMINAL Vc | LOAD 11 |
| 1 | 0 | 0 | 0 | LOAD 11 | LOAD 11 |
| 1 | 1 | 0 | 1 | LOAD 11 | TERMINAL Vc |

BATTERY UNIT AND INFORMATION PROCESSING SYSTEM HAVING BATTERY UNIT MOUNTED THEREIN

BACKGROUND OF THE INVENTION

1. Field of the Invention

The present invention relates to a battery unit and an information processing apparatus having the battery unit mounted therein. More particularly, this invention is concerned with a battery unit capable of monitoring the state (amount of remaining power or deterioration) of a cell with high precision and an information processing apparatus having the battery unit mounted therein.

2. Description of the Prior Art

Due to the trend toward downsizing information processing apparatuses, there is an increasing demand for portable apparatuses including notebook-type personal computers. In a portable apparatus, a battery is incorporated as a power source. When the portable apparatus is used in an environment in which an ac voltage cannot be obtained from the mains, it can be driven by a battery. More and more portable apparatuses are therefore including a secondary battery that can be used cyclically as a battery. A form of the secondary battery is a battery unit that is a battery pack having a plurality of cells connected in parallel with one another. This form is intended to cope with a large power consumption of an apparatus.

For detecting an amount of remaining power in such a battery unit, normally, the battery unit is connected to a main unit of an information processing apparatus. The battery unit supplies power to a load in the main unit. In other words, a no-load voltage provided by the battery unit is estimated based on a discharge current flowing into the load or a voltage produced by a cell. According to this technique for detecting an amount of remaining power, there is a problem that it is hard to detect an amount of remaining power accurately because a voltage varies depending on a change in current flowing through a load.

Moreover, since a plurality of cells is packed in the form of a battery unit, it is impossible to detect the state of the battery unit in units of a cell. If an amount of remaining power is unequal among the cells, part of a current to be supplied to a load may flow into a cell having a small amount of remaining power. This invites deterioration of a driving ability. Moreover, when the battery unit is charged, a phenomenon that a cell having a large amount of remaining power discharges towards a cell having a small amount of remaining power may take place. This poses a problem that an excess current may flow into the cell having a small amount of remaining power to eventually break down the cell.

SUMMARY OF THE INVENTION

An object of the present invention is to provide a battery unit making it possible to check the state thereof accurately even when power is supplied to a load, and to monitor the state thereof even in units of a cell, and an information processing apparatus employing the battery unit.

For accomplishing the object, a battery unit in accordance with the first aspect of the present invention includes a plurality of cells connected in parallel with one another, and a switch connected to at least one of the cells. In this unit, a specific cell can be disconnected from a load by controlling the switch. By detecting the state of the specific cell in this state, the state of the cell can be detected correctly.

The battery unit may be provided with a control circuit for controlling the on or off state of the switch. Operating the switch can thus be automated.

The battery unit may be provided with a voltage detection terminal at which a voltage across the terminals of a specific cell is developed. The state of the specific cell can thus be checked based on the voltage output through the voltage detection terminal.

The voltage detection terminal can be connected between the switch and cells. By turning on or off the switch, discharge from a cell connected to the switch to the load is discontinued. This enables detection of a voltage released from the cell.

Furthermore, a plurality of switches may be included to be associated with the plurality of cells. In this case, the control circuit turns of any of the switches in response to an external control signal. Consequently, any one cell can be disconnected from the load, and a no-load voltage provided by the cell can be detected in units of a cell.

Furthermore, a selecting circuit may be interposed between one voltage detection terminal and the cells to be connected to the voltage detection terminal. The number of cells to be connected to the voltage detection terminal can be limited. Thus, a cell that is an object of inspection can be located.

Furthermore, the control circuit may be designed to control the selecting circuit in response to an external control signal. Thus, selection of cells to be connected to the voltage detection terminal is executed automatically.

Furthermore, the control circuit may control the selecting circuit so that a cell connected to a switch that is off will be selected. Consequently, the cell from which no power is supplied to the load is connected to the voltage detection terminal.

Furthermore, the switches may be designed to connect the cells to either the load or voltage detection terminal. Consequently, the switches for turning on or off the connections between the cells and load also serve as the switches for turning on or off the connections between the cells and voltage detection terminal. Thus, the number of switches can be decreased.

Furthermore, the control circuit may be designed to control the switches in response to an external control signal and connect any of the switches to the voltage detection terminal. Consequently, a no-load voltage provided by a cell can be detected in units of a cell.

A battery unit in accordance with the second aspect of the present invention includes a plurality of cells connected in parallel with one another, and a resistor connected in series with at least one of the cells. Consequently, discharge from a cell, to which the resistor is connected, to a load can be suppressed. A voltage produced by the cell can be detected independently of a current flowing through the load.

In the battery unit, the resistor may be a variable resistor. A resistance can be adjusted in order to control a discharge current flowing out of a cell. Thus, a cell for which a voltage across terminals thereof is detected can be selected.

Furthermore, the battery unit may be provided with a control circuit for controlling a resistance offered by the variable resistor. Thus, setting a resistance can be automated.

Furthermore, a voltage detection terminal may be interposed between the resistor and cells. In this case, the resistance to be offered by the resistor is increased in order to suppress a discharge current flowing into the load. A voltage nearly equal to a no-load voltage provided by the cell is developed at the voltage detection terminal. Consequently, a voltage across the terminals of the cell can be measured accurately.

Furthermore, a plurality of resistors may be included to be associated with the plurality of cells. In this case, the control circuit makes a resistance to be offered by any of the resistors larger than that to be offered by the other resistors in response to an external control signal. Thus, discharge from any cell to the load is suppressed. Consequently, the state of each cell in the battery unit can be checked in units of a cell.

Furthermore, the battery unit may be provided with a selecting circuit for selecting a cell to be connected to the voltage detection terminal. Thus, a cell that is an object of inspection can be located.

Furthermore, the control circuit may control the selecting circuit in response to an external control signal. Thus, the selecting circuit can be controlled automatically. Furthermore, the control circuit may be designed to control the selecting circuit so that a cell connected to a resistor that is set to a maximum resistance will be selected. Thus, a cell, having a discharge current which flows into the load limited by the resistor, can be connected to the voltage detection terminal.

According to the third aspect of the present invention, there is provided an information processing apparatus comprising: a main unit; a battery unit having a plurality of cells thereof connected in parallel with one another, and supplying power to the main unit when freely detachably attached to the main unit; a power supply control circuit for designating any of the plurality of cells and requesting the battery unit to notify it of the state of the designated cell; and a state detection terminal used to detect the state of the cell designated by the power supply control circuit.

According to the apparatus, the individual state of the cells constituting the battery unit can be recognized. An abnormal cell can be located.

According to the fourth aspect of the present invention, there is provided a method of checking the state of a battery unit, which has a plurality of cells connected in parallel with one another and supplies power to a load, by disconnecting the cells one by one from the load so as to thus detect a voltage across the terminals of a disconnected cell.

Consequently, the state of each of the cells constituting the battery unit can be detected with the cell disconnected from the load. The state of each cell can thus be learnt accurately.

Furthermore, there is provided a method of supplying power to a load while disconnecting a cell, in which an abnormality has been detected as a result of detecting the states of cells, from the load. Thus, an outflow of energy from normal cells to the abnormal cell can be prevented and a discharge time can be extended. Moreover, inflow of a charge current to the abnormal cell can be prevented, and a charge time can be shortened.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the embodiments of the present invention, the related art and the disadvantages therein will be described with reference to the related figure.

Figure 23:
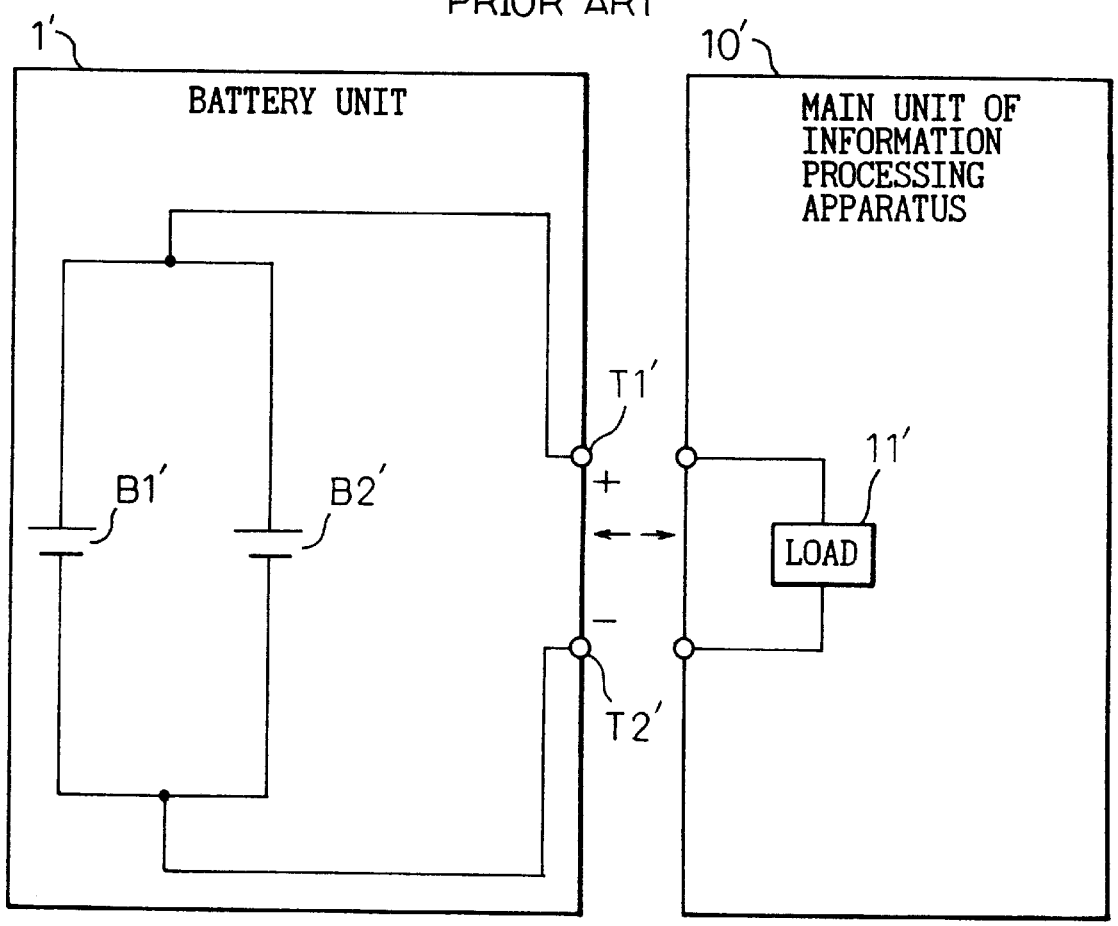
FIG. 23 is a diagram showing a battery unit in accordance with a prior art and a main unit of an information processing apparatus.

FIG. 23 is a diagram showing the configuration of a battery unit in accordance with a prior art.

The battery unit 1' has a plurality of cells B1' and B2' connected in parallel with each other. A terminal T' is the positive terminal of the battery unit and a terminal T2' is the negative terminal thereof. The battery unit 1' is freely detachably attached to a main unit 10' of equipment which is a notebook-type personal computer or the like. The battery unit 1' supplies power to a load 11' in the main unit 10' of equipment which is inserted between the terminals T1' and T2'. An amount of remaining power of the battery unit 1' is estimated based on a voltage between the terminal T1' and terminal T2'.

According to the foregoing technique of detecting an amount of remaining power, the voltage between the terminals T1' and T2' varies depending on a change in current flowing through the load or load current. It is therefore hard to detect an amount of remaining power accurately. Moreover, the cells B1' and B2' are connected in parallel with each other, thus constituting the battery unit 1'. The respective states of the cells B1' and B2' cannot therefore be detected. In other words, even if the amounts of remaining power of the cells B1' and B2' are mutually unequal, the unequality cannot be detected. This leads to the aforesaid various problems stemming from the unequal amounts of remaining power of cells.

Figure 1:
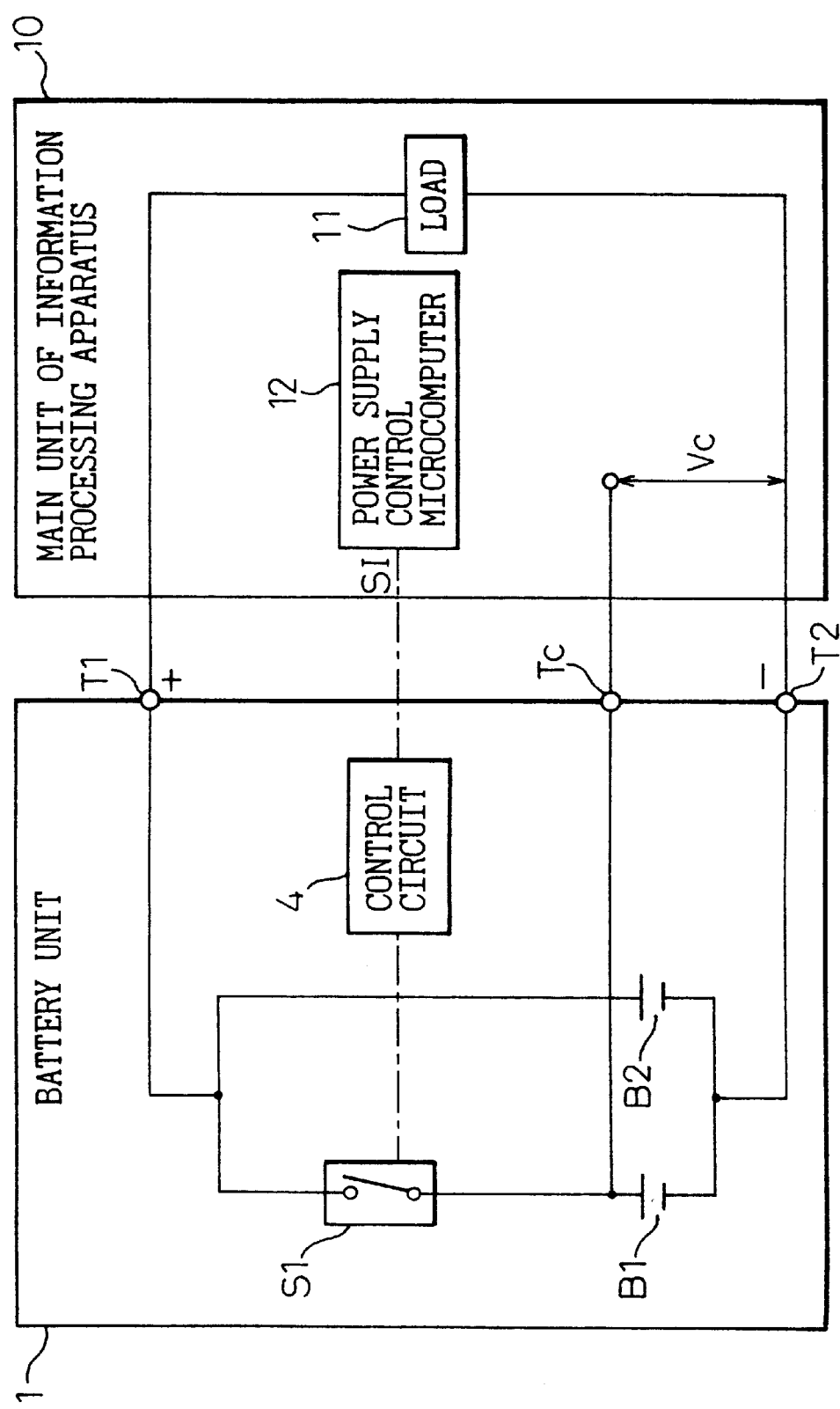
FIG. 1 is a diagram showing the first embodiment of the present invention.

FIG. 1 shows a battery unit in accordance with the first embodiment of the present invention and a main unit of an information processing apparatus to which the battery unit is attached. The battery unit shown in FIG. 1 has the most fundamental configuration of the present invention.

In the figures below, the solid lines indicate power supplying lines and the broken lines indicate signal lines.

In FIG. 1, there are shown cells B1 and B2 of the same type and same capacity. The cells are, for example, lithium ion cells. The cells B1 and B2 are connected in parallel with each other, thus constituting a battery unit (battery pack) 1. A switch Si makes or breaks a discharge path from the cell B1 to a load 11. A semiconductor device such as an FET or bipolar transistor or a relay may be used as the switch S1. A control circuit 4 controls make or break of the switch S1. A voltage detection terminal Tc is connected to the positive terminal of the cell B1.

Moreover, there is shown a main unit 10 of an information processing apparatus (for example, a notebook-type personal computer or portable telephone set). A power supply control microcomputer 12 for monitoring or controlling supply of power to the load 11 or main unit is incorporated in the main unit.

The actions of the battery unit shown in FIG. 1 will be described below.

The battery unit 1 is detachably attached to the main unit 10. Moreover, the load 11 in the main unit 10 is connected between the positive terminal T1 and negative terminal T2 of the battery unit. When the main unit 11 is used outdoors or the mains providing an ac voltage are interrupted to cause a power failure, the load 11 is powered by the battery unit 1.

When the switch S1 is made, the cells B1 and B2 are both supplying power to the load 11.

In this state, the power supply control microcomputer 12 sends a state detection request signal SI to the control circuit 4. In response to the signal, the control circuit 4 transmits a control signal, with which the switch S1 is turned off, to the switch S1. In FIG. 1, there is only one control line. The signal SI is a signal of one bit long. Either of the logic levels of the signal SI specifies the on state of the switch S1, and the other logic level specifies the off state thereof.

The switch S1 is turned off in response to a control signal. When the switch S1 is turned off, discharge from the cell B1 to the load 11 is cut off. Only the cell B2 supplies power to the load 11. A voltage produced by the cell B1 disconnected from the load 11 is developed between the voltage detection terminal Tc and the negative terminal T2 of the battery unit 1. The power supply control microcomputer 12 in the main unit 10 judges the state of the cell B1 from a voltage Vc. The voltage Vc that is a no-load voltage provided by the cell B1 can be detected by inserting a resistor, which offers a high resistance (approximately 100 MΩ), between the terminals Tc and T2.

For the cell B1 out of the cells B1 and B2 included in the battery unit 1, a voltage produced thereby can be detected solely. Moreover, detecting the voltage produced by the cell B1 will be unaffected by a change in load because it is carried out with the cell B1 disconnected from the load 11. Thus, high-precision state detection can be achieved.

Figure 2:
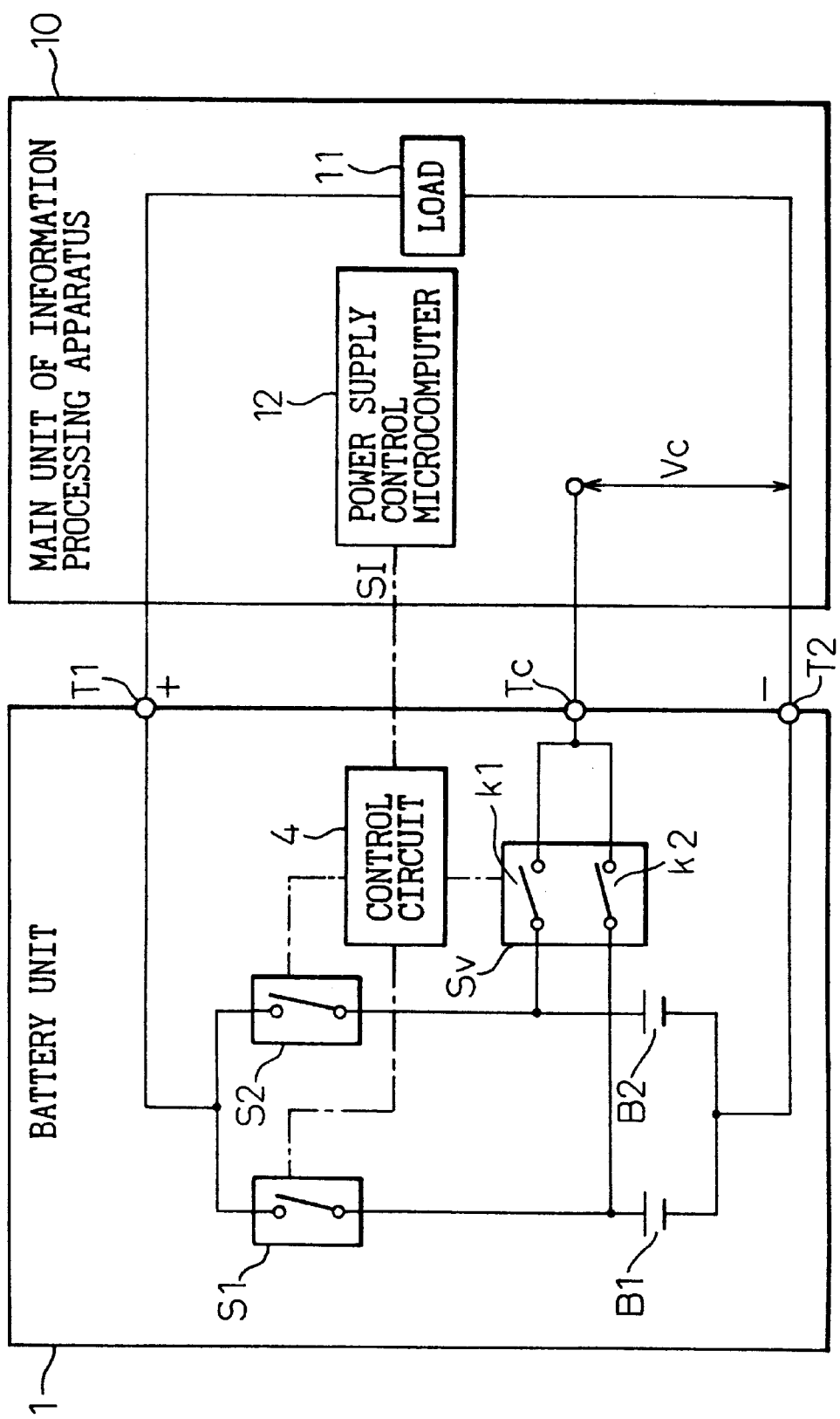
FIG. 2 is a diagram showing the second embodiment of the present invention.

FIG. 2 is a diagram showing the configuration of a battery unit in accordance with the second embodiment of the present invention, and that of a main unit of an information processing apparatus to which the battery unit is attached. The battery unit shown in FIG. 2 has the configuration enabling detection of voltages produced by two respective cells in a battery pack.

In FIG. 2 there is shown a switch S2 for making or breaking a discharge path linking the cell B2 and load 11. A selecting circuit Sv connects either of the cells B1 and B2 to the voltage detection terminal Tc. The control circuit 4 shown in FIG. 2 controls the switches S1 and S2 and switches K1 and K2 in the selecting circuit Sv in response to a control signal sent from the main unit 10 of the information processing apparatus.

The actions of the battery unit 1 shown in FIG. 2 will be described below.

The load 11 in the main unit 10 is inserted between the positive terminal T1 of the battery unit and the negative terminal T2 thereof. When it is unnecessary to detect the states of the cells, the switches S1 and S2 are made. The cells B1 and B2 both supply power to the load 11. Moreover, the selecting circuit Sv is placed in a state in which it is selecting neither the cell B1 nor cell B2.

In this state, the power supply control microcomputer 12 in the main unit 10 issues a state detection request SI to the control circuit 4. In response to the request, the control circuit 4 first transmits a control signal, with which the switch S1 is turned off, to the switch S1. Moreover, the control circuit 4 transmits a selection signal, with which the cell B1 is selected as a cell to be connected to the power supply detection terminal Vc, to the selecting circuit Sv.

If the switch S1 is turned off in response to the control signal, discharge from the cell B1 to the load 11 is cut off and only the cell B2 supplies power to the load 11. Moreover, the selecting circuit Sv connects the cell B1 to the voltage detection terminal Tc in response to the selection signal. A voltage produced by the cell B1 disconnected from the load 11 is therefore developed between the voltage detection terminal Tc and the negative terminal T2 of the battery unit 1. The power supply control microcomputer 12 in the main unit 10 judges the state of the cell B1 from the voltage.

After the power supply control microcomputer 12 recognizes the state of the cell B1, it issues a state detection request SI to the control circuit 4 so as to check the state of the other cell.

In response to the state detection request signal SI, the control circuit 4 transmits a control signal, with which the switch S1 is turned on, to the switch S1 that is off. Moreover, the control circuit 4 transmits a control signal, with which the switch S2 is turned off, to the switch S2. Moreover, the control circuit transmits a selection signal, with which the cell B2 is selected as a cell to be connected to the voltage detection terminal Tc, to the selecting circuit Sv. If a signal used to turn off the switch S2 were issued prior to a signal used to turn on the switch S1, a time zone during which both the switches S1 and S2 are off would be created. During the time zone, supply of power to the load would be discontinued. The control circuit 4 therefore operates to first transmit the signal used to turn on the switch S1 and then transmit the signal used to turn off the switch S2.

In response to the control signals, the switch S1 is turned on and the switch S2 is turned off. Consequently, discharge from the cell B1 to the load 11 is cut off, and only the cell B2 supplies power to the load 11. Moreover, the selecting circuit Sv connects the cell B2 to the voltage detection terminal Tc in response to the selection signal. A voltage produced by the cell B2 disconnected from the load 11 is therefore developed between the voltage detection terminal Tc and the negative terminal T2 of the battery unit 1. The power supply control microcomputer 12 in the main unit 10 judges the state of the cell B2 from the voltage.

Figure 3:
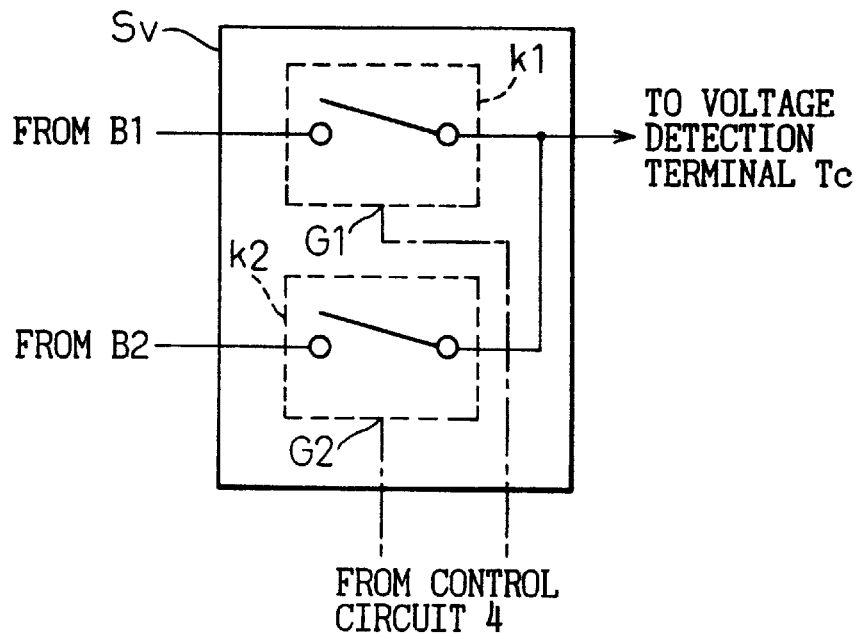
FIG. 3 is a diagram showing the interior of a selecting circuit Sv shown in FIG. 2.

FIG. 3 shows the selecting circuit Sv. The selecting circuit Sv is composed of a switch k1 for disconnecting the cell B1 from the voltage detection terminal Vc, and a switch k2 for disconnecting the cell B2 from the voltage detection terminal Tc. The on or off state of the switch k1 is controlled with a control signal of one bit long supplied through a control terminal G1. The on or off state of the switch k2 is controlled with a control signal of one bit long supplied through a control terminal G2.

Figure 4:
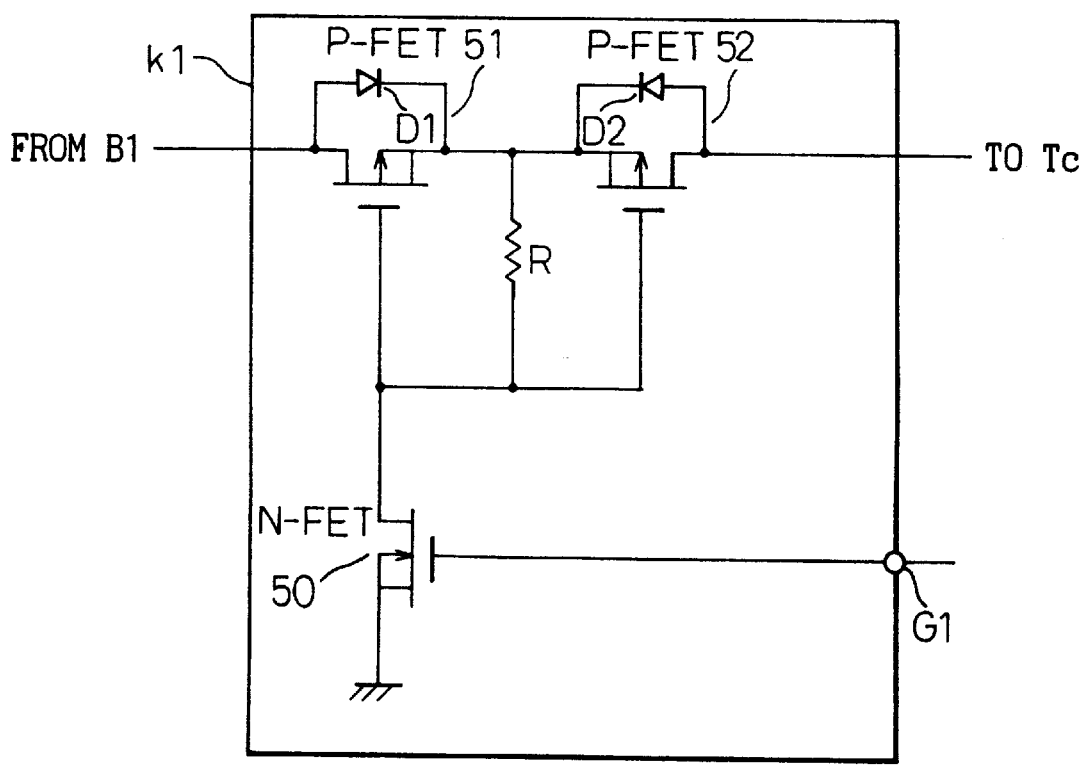
FIG. 4 is a circuit diagram of a switch included in the selecting circuit Sv.

FIG. 4 is a circuit diagram of the switch k1 shown in FIG. 3. The switch k1 is composed of one n-channel FET 50 and two p-channel FETs 51 and 52. Parasitic diodes D1 and D2 are parasitic to the p-channel FETs 51 and 52.

In the switch k1 in FIG. 4, when a signal representing logical 1 is input through the control terminal G1, the n-channel FET 50 is turned on. The two p-channel FETs 51 and 52 are turned on because the gate voltages thereof are lowered to the ground level. Consequently, the cell B1 is connected to the voltage detection terminal Tc.

On the other hand, when a signal representing logical 0 is input through the control terminal G, the n-channel FET 50 is turned off. The two p-channel FETs 51 and 52 are turned off because the gate voltages thereof are driven high due to a voltage that is produced by the cell B1 and supplied via the parasitic diode D1 and a resistor R. Consequently, the cell B1 is disconnected from the voltage detection terminal Tc.

The switch k2 has the same circuitry as the switch k1. When a signal representing logical 1 is input through the terminal G2, the switch k2 is turned on. When a signal representing logical 0 is input, the switch k2 is turned off.

Figures 5, 6:
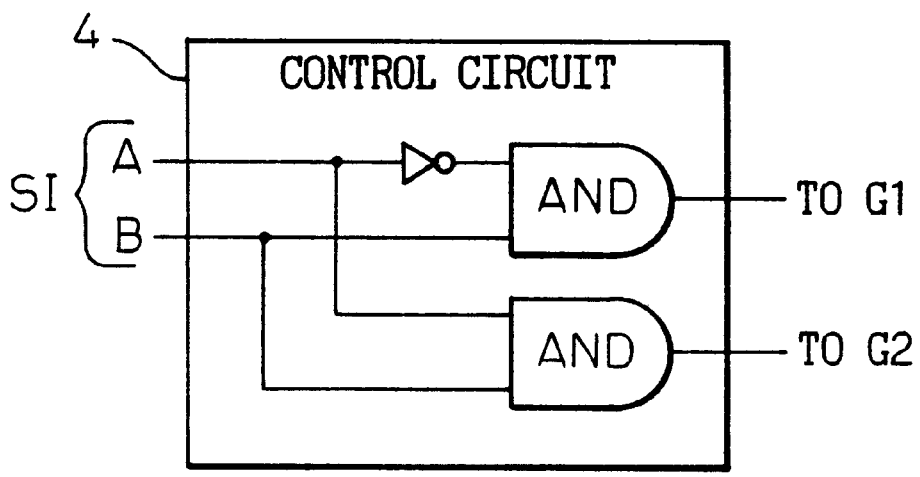
FIG. 5 is a diagram showing the interior of a control circuit shown in FIG. 2.
FIG. 6 is a diagram showing the relationship of correspondence between a bit stream constituting an SI signal and a cell that is an object of inspection.

FIG. 5 shows an internal circuit of the control circuit 4 shown in FIG. 2. A state detection request signal SI of two bits long is supplied from the power supply control microcomputer 12 to the control circuit 4 over two control lines. Based on the combination of the bits, it is determined which of the cells is connected to the voltage detection terminal Tc.

FIG. 6 shows a table indicating the relationship between the values of bits A and B constituting the state detection request signal SI, the levels of outputs applied from the selecting circuit 4 to the control terminals G1 and G2, and the actions of the switches k1 and k2. As seen from FIG. 6, three states are specified by changing the combination of the values of bit A and bit B constituting the state detection request signal. The three states include a state in which the switch k1 alone is on, a state in which the switch k2 alone is on, and a state in which the switch k1 and switch k2 are both off. Incidentally, the battery unit is designed so that a state in which the switch k1 and switch k2 are both on will not be established.

Figure 7:
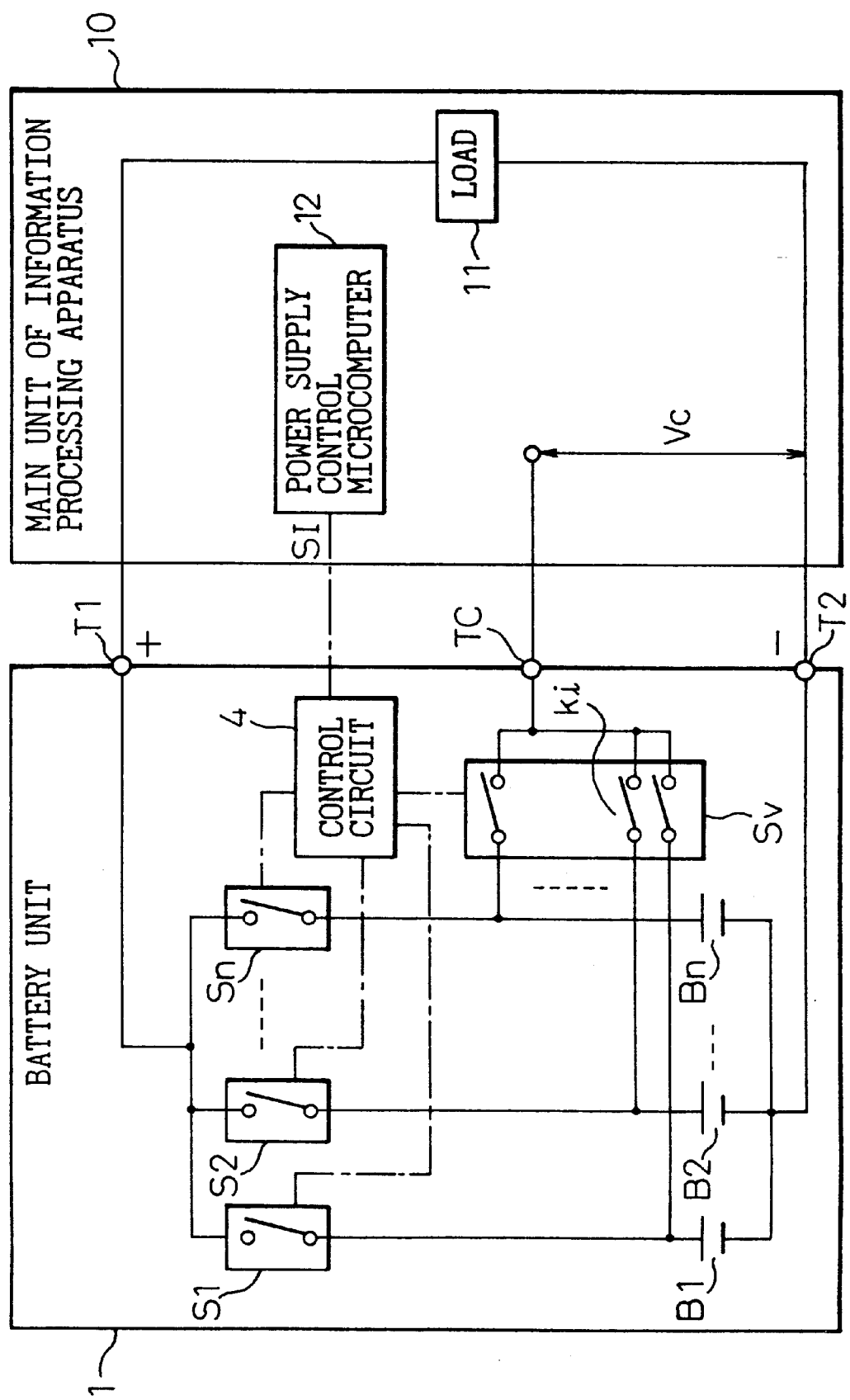
FIG. 7 is a diagram showing the third embodiment of the present invention.

FIG. 7 shows a battery unit in accordance with the third embodiment of the present invention, and a main unit of an information processing apparatus to which the battery unit is attached. The battery unit shown in FIG. 2 is a general-purpose version of the one shown in FIG. 2.

In FIG. 7, there are shown cells Bi (i=1, 2, 3, etc., and n). The cells are connected in parallel with one another, thus constituting a battery unit 1. Switches Si (i=1, 2, 3, etc., and n) are connected in series with the cells Bi. The switches Si make or break the discharge paths extending from the cells Bi. Moreover, a selecting circuit Sv can select any of the cells Bi and connect the selected cell to a voltage detection terminal Vc.

The actions of the battery unit shown in FIG. 7 will be described below.

The load 11 in the main unit 10 of the information processing apparatus is inserted between the positive terminal T1 and negative terminal T2 of the battery unit 1. When the load 11 in the main unit 10 is powered by the battery unit 1, the switches S1 to Sn are usually made. All the cells in the battery unit therefore supply power to the load. Moreover, the selecting circuit Sv is placed in a state in which it is not selecting a cell.

In this state, the power supply control microcomputer 12 in the main unit 10 issues a state detection request SI to the control circuit 4. In response to the request, the control circuit 4 transmits a control signal, with which any switch Si is turned off, to the switch Si. Moreover, the control circuit 4 transmits a selection signal, with which the cell B(i+1) is selected as a cell to be connected to the voltage detection terminal Tc, to the selecting circuit Sv.

The switch Si is turned off in response to the control signal. When the switch Si is turned off, discharge from the cell Bi to the load 11 is cut off. The remaining cells alone supply power to the load 11. Moreover, the selecting circuit Sv connects the cell Bi to the voltage detection terminal Tc in response to the selection signal. A voltage Vc produced by the cell Bi disconnected from the load 11 is therefore developed between the voltage detection terminal Tc and the negative terminal of the battery unit 1. The power supply control microcomputer 12 in the main unit 10 judges the state of the cell Bi from the voltage.

After the power supply microcomputer 12 checks the state of the cell Bi, it issues a state detection request SI to the control circuit 4 so as to check the state of another cell B(i+1).

In response to the state detection request signal SI, the control circuit 4 transmits a control signal, with which a switch Si that is off is turned on, to the switch Si, and transmits a control signal, with which a switch S(i+1) is turned off, to the switch S(i+1). Moreover, the control circuit 4 transmits a selection signal, with which a cell B(i+1) is selected as a cell to be connected to the voltage detection terminal Tc, to the selecting circuit Sv.

In the battery unit shown in FIG. 2, the control circuit 4 transmits a signal used to turn off the switch S2 after transmitting a signal used to turn on the switch S1. When a battery unit is composed of three or more cells, even if two switches were turned off simultaneously, power supply to the load would not be discontinued. However, for lightening the load on the cells, even in this embodiment, the switch S(i+1) should preferably be turned off after the switch Si is turned on.

In response to the control signals, the switch Si is turned on and the switch S(i+1) is turned off. Discharge from the cell B(i+1) to the load is cut off. The other cells supply power to the load 11. Moreover, the selecting circuit Sv connects the cell B(i+1) to the voltage detection terminal Tc in response to the selection signal. A voltage produced by the cell B(i+1) disconnected from the load 11 is therefore developed between the voltage detection terminal Tc and negative terminal T2 of the battery unit 1. From the voltage, the power supply control microcomputer 12 in the main unit 10 judges the state of the cell B(i+1).

If the voltage produced by the cell B(i+1) is lower than a specified value, the power supply control microcomputer 12 judges that an amount of remaining power is insufficient. In this case, the control circuit 4 may be instructed to keep the switch Si in the off state for fear the cell Bi might be discharged.

The selecting circuit Sv in FIG. 7 is also provided with switches ki associated with the cells. Moreover, a state detection request signal SI output from the power supply control microcomputer 12 to the control circuit 4 is composed of the same number of bits as the number of cells. Depending on the combination of logical levels to be represented by the digits, one of the switches in the selecting circuit Sv is turned on or all the switches are turned off.

Figure 8:
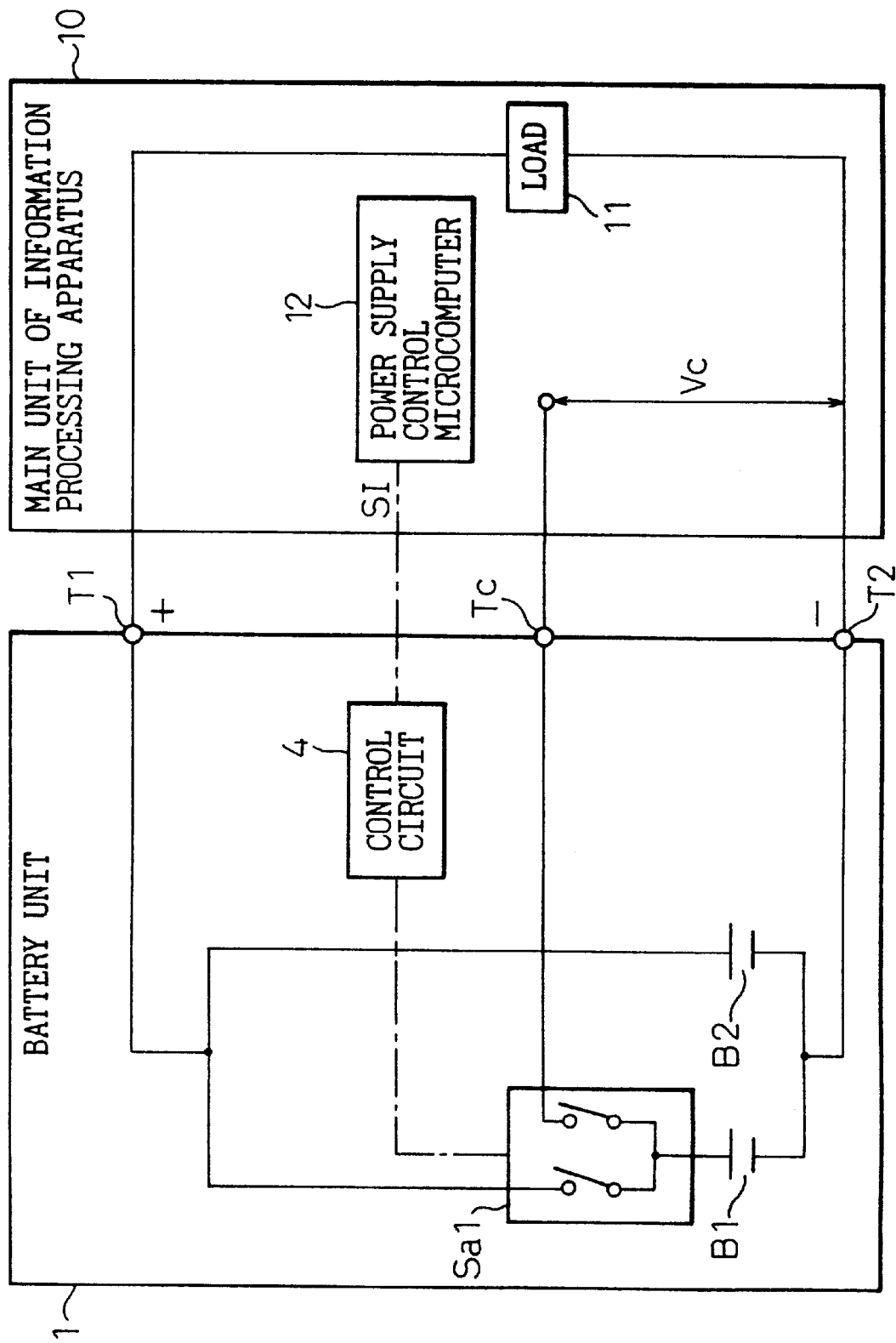
FIG. 8 is a diagram showing the fourth embodiment of the present invention.

FIG. 8 shows a battery unit in accordance with the fourth embodiment of the present invention and a main unit of an information processing apparatus to which the battery unit is attached.

In FIG. 8, the same reference numerals are assigned to circuit elements identical to those that have already been described and a description of the circuit elements will be omitted. A switch Sa1 is a switch for selecting a destination of discharge of the cell B1. The destination of discharge of the cell B1 is selected from between the load 11 in the main unit 10 and the voltage detection terminal Tc.

The actions of the battery unit shown in FIG. 8 will be described below.

The battery unit 1 is detachably attached to the main unit 10. Moreover, the load 11 in the main unit 10 is connected between the positive terminal T1 of the battery unit 1 and the negative terminal T2 thereof.

When the cell B1 and cell B2 are both supplying power to the load 11, the selection switch Sa1 is selecting the load as the destination of discharge of the cell B1.

In this state, the power supply control microcomputer 12 issues a state detection request SI to the control circuit 4. In response to the request, the control circuit 4 transmits a selection signal to the selection switch Sa1. In FIG. 8, there is shown only one control line. The request SI is a one-bit-long signal. Either of the logic levels of the request signal SI designates the load 11 as the destination to which the cell B1 is connected. The other logic level thereof designates the voltage detection terminal Tc as the destination to which the cell B1 is connected. Moreover, the control signal supplied from the control circuit 4 to the switch Sa1 is a one-bit-long signal.

In response to the control signal, the selection switch Sa changes the destination to which the cell B1 is connected from the load 11 to the voltage detection terminal Tc. When the selection switch Sa is changed over, discharge from the cell B1 to the load 11 is cut off. The cell B2 alone supplies power to the load 11. A voltage produced by the cell B1 disconnected from the load 11 is therefore developed between the voltage detection terminal Tc and the negative terminal T2 of the battery unit 1. The power supply control microcomputer 12 in the main unit 10 judges the state of the cell B1 from the voltage.

For the cell B1 out of the cells B1 and B2 included in the battery unit 1, a voltage produced thereby can be checked solely. Moreover, detecting the voltage produced by the cell B1 will be unaffected by a change in load current because it is carried out with the cell B1 disconnected from the load 11. Thus, high-precision state detection can be achieved.

Figure 9:
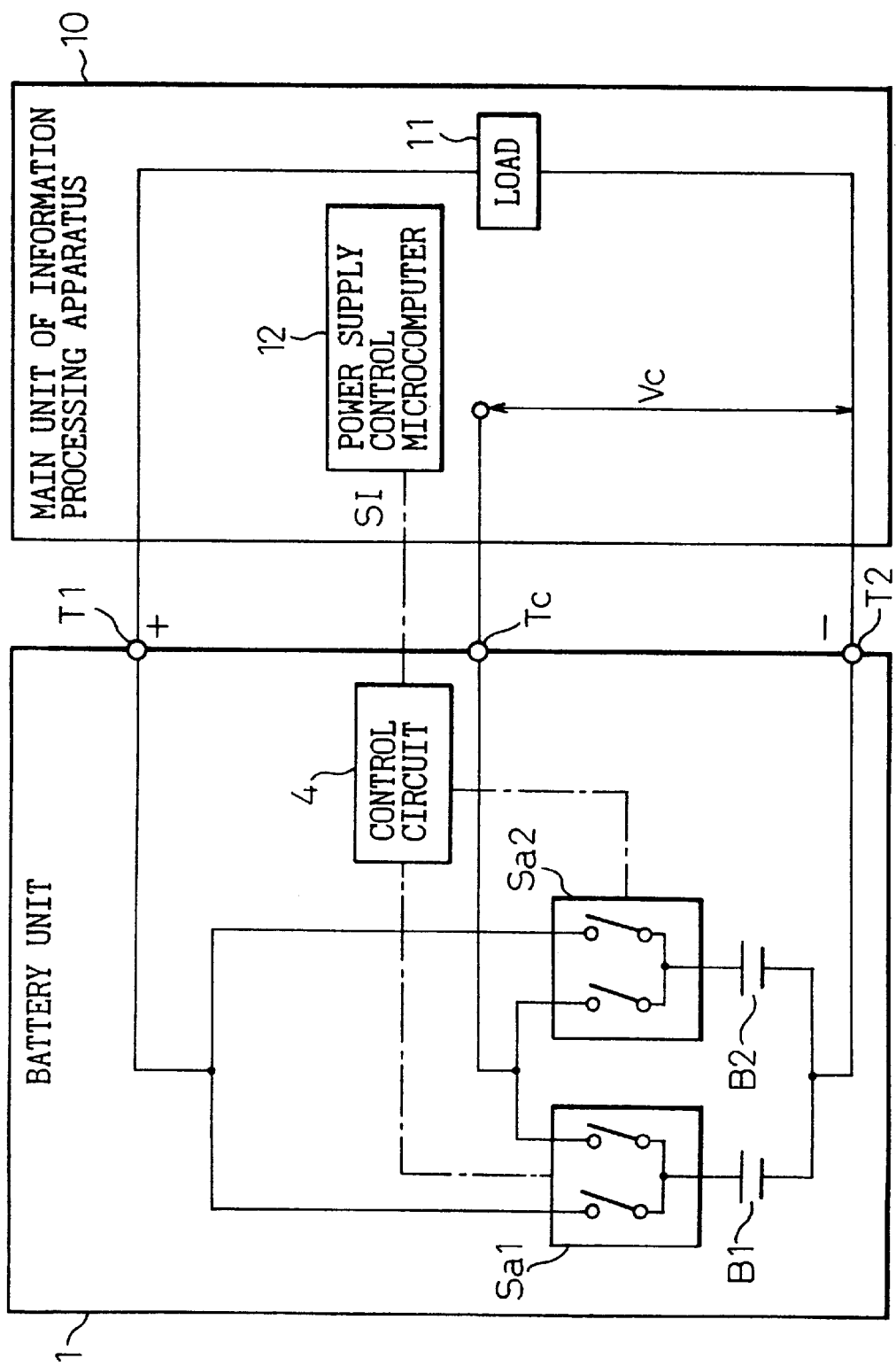
FIG. 9 is a diagram showing the fifth embodiment of the present invention.

FIG. 9 shows a battery unit in accordance with the fifth embodiment of the present invention and a main unit of an information processing apparatus to which the battery unit is attached. In the battery unit shown in FIG. 8, it is impossible to check the state of the cell B2 solely. The battery unit shown in FIG. 9 is configured to be able to check the states of the cell B1 and cell B2 mutually independently.

The battery unit shown in FIG. 9 is, in addition to the selection switch Sa1 shown in FIG. 8, provided with a selection switch Sa2 for selecting the load 11 or voltage detection terminal Tc as the destination of discharge of the cell B2. The cell B2 can be connected to the voltage detection terminal Tc.

The actions of the battery unit shown in FIG. 9 will be described below.

The load 11 in the main unit 10 is inserted between the positive terminal T1 and negative terminal T2 of the battery unit 1. When the load 11 in the main unit 10 is powered by the battery unit 1, the switch Sa1 or Sa2 selects the load 11 as the destination to which a cell is connected. The cell B1 and cell B2 both supply power to the load.

In this state, the power supply microcomputer 12 in the main unit issues a state detection request SI to the control circuit 4. In response to the request, the control circuit 4 first transmits a control signal, with which the destination to which the cell B1 is connected is changed to the voltage detection terminal Tc, to the selection switch Sa1.

In response to the control signal, the selection switch Sa1 connects the cell B1 to the voltage detection terminal Tc. When the destination to which the cell B1 is connected is changed to the voltage detection terminal Vc, discharge from the cell B1 to the load 11 is cut off. The cell B2 alone supplies power to the load 11. A voltage produced by the cell B1 disconnected from the load 11 is therefore developed between the voltage detection terminal Tc and the negative terminal T2 of the battery unit 1. The power supply control microcomputer 12 in the main unit 10 judges the state of the cell B1 from the voltage.

The power supply control microcomputer 12 checks the state of the cell B1, and then issues a state detection request signal SI to the control circuit 4 so as to check the state of the other cell.

In response to the state detection request signal SI, the control circuit 4 transmits a control signal to the selection switch Sa1 that has connected the cell B1 to the voltage detection terminal Tc. The control circuit 4 thus instructs the selection switch Sa1 to connect the cell B1 to the load 11. Moreover, the control circuit 4 transmits a control signal to the selection switch Sa2 and thus instructs the selection switch Sa2 to connect the cell B2 to the voltage detection terminal Tc. Before the cell B1 is connected to the load 11, if the cell B2 were connected to the voltage detection terminal Tc, a time zone during which power supply to the load 11 is discontinued would be created. The control circuit 4 therefore first outputs the control signal, with which the destination to which the cell B1 is connected is changed to the load 11, to the selection switch Sa1, and then outputs the control signal, with which the destination to which the cell B2 is connected is changed to the voltage detection terminal Tc. to the selection switch Sa2.

In response to the control signals, the selection switch Sa1 connects the cell B1 to the load 11, and the selection switch Sa2 connects the cell B2 to the voltage detection terminal Tc. When the destination to which the cell B2 is connected is changed to the voltage detection terminal Tc, discharge from the cell B2 to the load 11 is cut off. The cell B1 alone supplies power to the load 11. A voltage produced by the cell B2 disconnected from the load 11 is therefore developed between the voltage detection terminal Vc and the negative terminal T2 of the battery unit 1. The power supply control microcomputer 12 in the main unit 10 judges the state of the cell B2 from the voltage.

Figure 10:
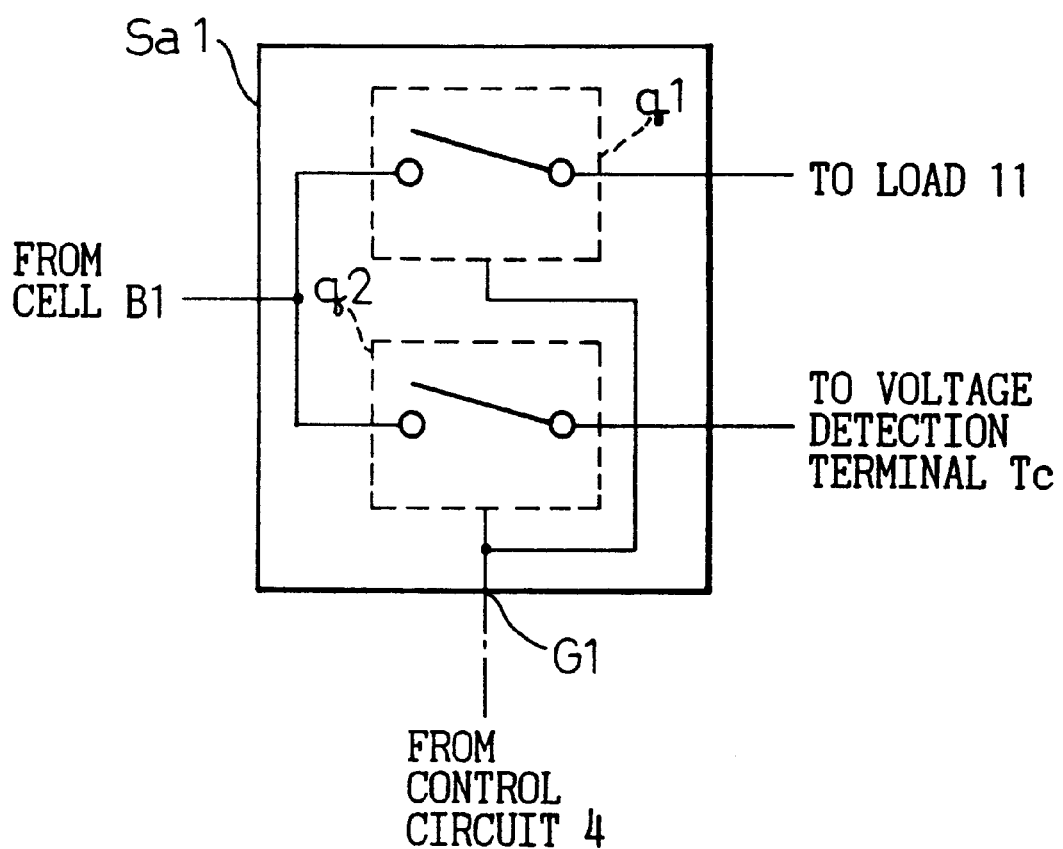
FIG. 10 is a diagram showing the interior of a switching circuit Sa1 shown in FIG. 9.

FIG. 10 shows the interior of the selection switch Sa1. The selection switch Sa1 is composed of a switch q1 for disconnecting the cell B1 from the load 11 and a switch q2 for disconnecting the cell B1 from the voltage detection terminal Tc. Depending on the logic level of a one-bit-long control signal to be input from the control circuit 4 through the control terminal G1, the switches q1 and q2 assume opposite states. When a logical "1" is input through the control terminal G1, the switch q2 is turned on. When a logical "0" is input, the switch q1 is turned on.

Figure 11:
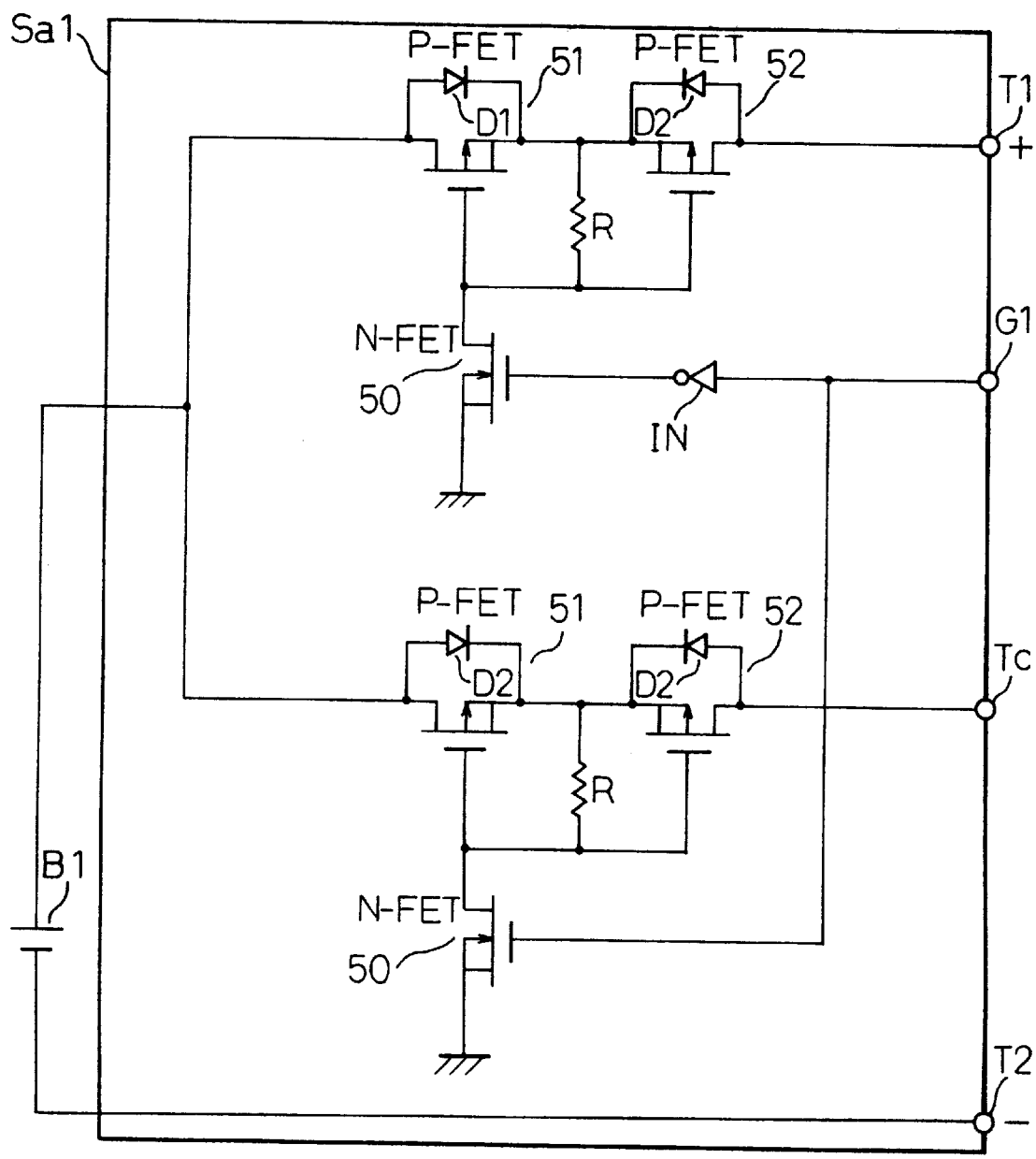
FIG. 11 is a circuit diagram of the switching circuit Sa1.

FIG. 11 is a circuit diagram of the selection switch Sa1. The switches q1 and q2 are each composed of one n-channel FET 50 and two p-channel FETs 51 and 52. Parasitic diodes D1 and D2 are parasitic on the p-channel FETs 51 and 52.

In the switch q1 shown in FIG. 11, when a signal representing logical 1 is input through the control terminal G1, a signal representing logical 0 is applied to the gate of the n-channel FET 5 via an inverting gate IN. The n-channel FET 50 is then turned off. Consequently, the two p-channel FETs 51 and 52 are turned off.

On the other hand, in the switch q2, a signal representing logical 1 is input through the control terminal G1 and then applied to the gate of the n-channel FET 50. The n-channel FET 50 is then turned on. Consequently, the two p-channel FETs 51 and 52 are both turned on.

When the signal representing logical 1 is input through the control terminal G1, the switch q1 is turned off and the switch q2 is turned on. The cell B1 is connected to the voltage detection terminal Tc.

In contrast, when the signal representing logical 0 is input through the control terminal G1, the switch q1 is turned on and the switch q2 is turned off. The cell B1 is connected to the load 11.

The selection switch Sa2 in FIG. 8 has the same circuitry as the selection switch Sa1. When a control signal representing logical 1 is input from the control circuit 4, the selection switch Sa2 connects the cell B2 to the voltage detection terminal Tc. When a signal representing logical 0 is input, the selection switch Sa2 connects the cell B2 to the load 11.

Figures 12, 13:
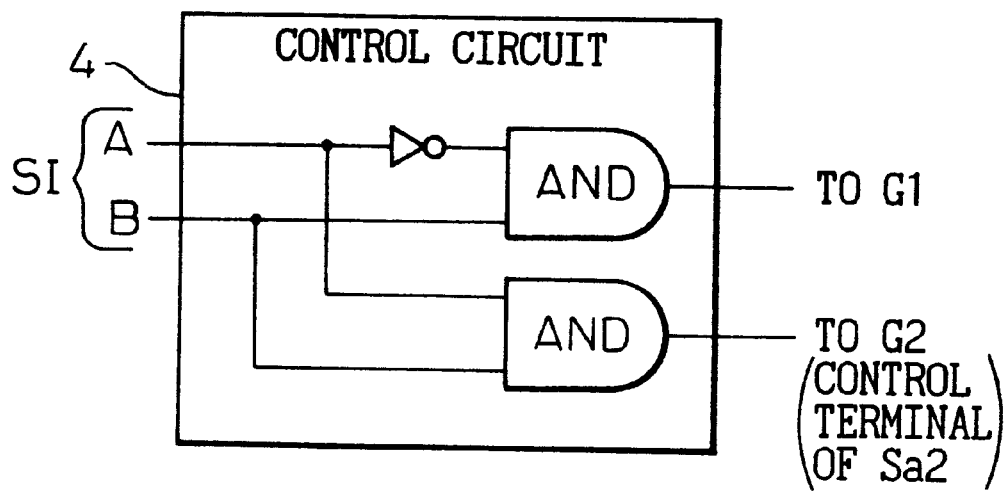
FIG. 12 is a diagram showing the interior of a control circuit 4 shown in FIG. 9.
FIG. 13 is a diagram showing the relationship of correspondence between a bit stream constituting an SI signal and a cell that is an object of inspection.

FIG. 12 shows an internal circuit of the control circuit shown in FIG. 9. A state detection request signal SI of two bits long is supplied from the power supply control microcomputer to the control circuit 4. Depending on the combination of the values of bits A and B, it determines which of the load and voltage detection terminals each cell is connected to.

FIG. 13 shows a table indicating the relationship among the values of bits constituting a state detection request signal SI, the logic levels of control signals output from the control circuit 4 through the control terminals of the selection switches, and the destinations to which the cells are connected. As seen from FIG. 3, by changing the combination of the values of bit A and bit B constituting the state detection request signal, three states are determined. The three states include a state which the cell B1 alone is connected to the voltage detection terminal Tc, a state in which the cell B2 alone is connected to the voltage detection terminal Tc, and a state in which the cells are connected to the load 11. Incidentally, the battery unit is designed so that a state in which the cells B1 and B2 are both connected to the voltage detection terminal Tc will not be established.

Figure 14:
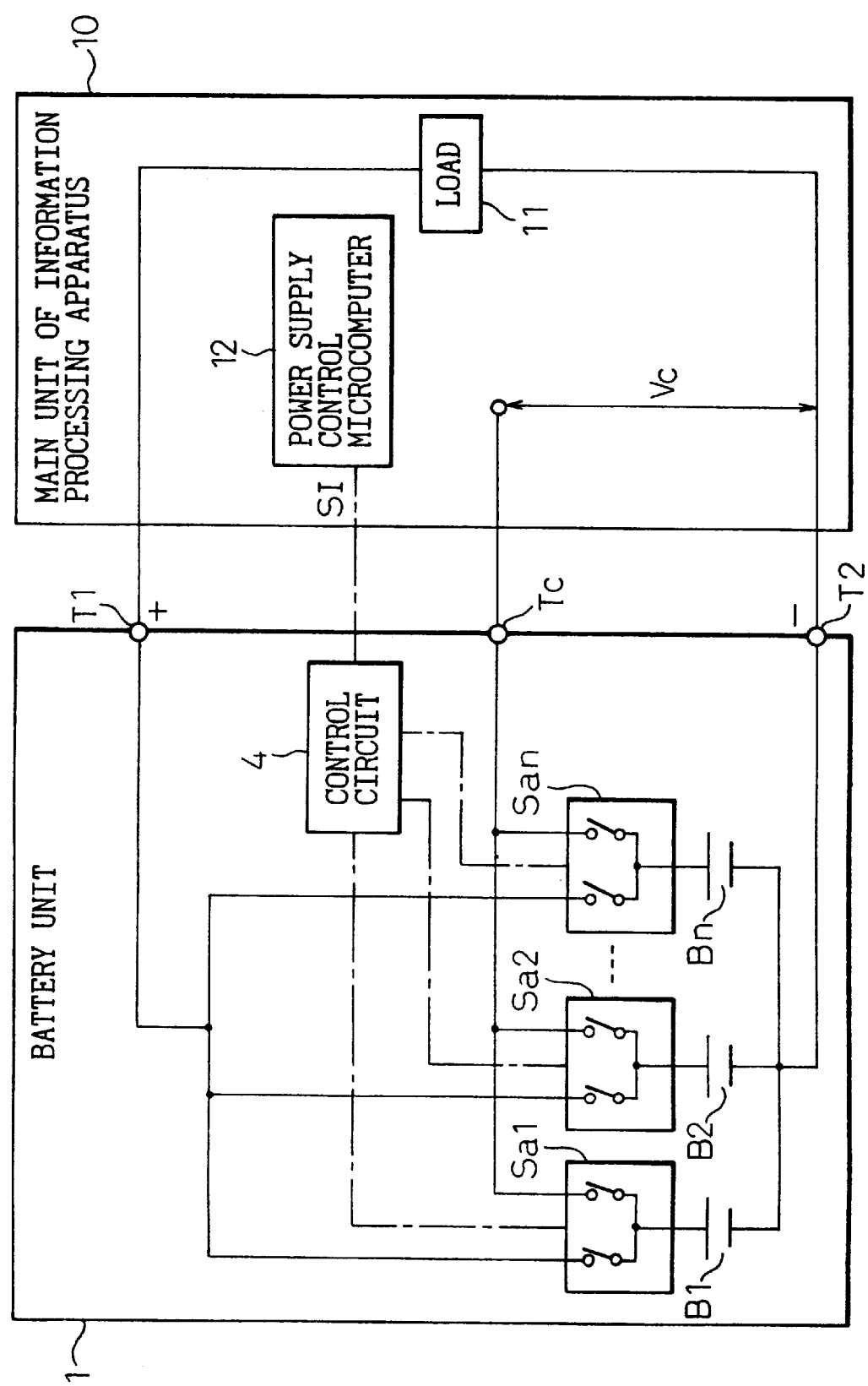
FIG. 14 is a diagram showing the sixth embodiment of the present invention.

FIG. 14 shows a battery unit in accordance with the sixth embodiment of the present invention and a main unit of an information processing apparatus to which the battery unit is attached. The battery unit shown in FIG. 14 is a general-purpose version of the battery unit shown in FIG. 9.

In FIG. 14, there are shown cells Bi (i=1, 2, 3, etc., and n). The cells Bi are connected in parallel with one another, thus constituting a battery unit 1. Switches Sai (i=1, 2, 3, etc., and n) are connected in series with the cells Bi. The switches Sai select the load 11 or voltage detection terminal Vc as a destination to which the cells Bi are connected.

The actions of the battery unit shown in FIG. 14 will be described below.

The load 11 in the main unit 10 is inserted between the positive terminal T1 and negative terminal T2 of the battery unit 1. When the load 11 in the main unit 10 is powered by the battery unit 1, the switches Sa1 to Sn usually connect the cells to the load 11. Thus, all the cells in the battery unit 1 supply power to the load.

In this state, the power supply control microcomputer 12 in the main unit 10 issues a state detection request SI to the control circuit 4. In response to the request, the control circuit 4 transmits a signal, with which the destination to which any of the cells Bi is connected is changed to the voltage detection terminal Tc, to any of the selection switches Sai.

The selection switch Sai connects the associated cell Bi to the voltage detection terminal Tc. When the selection switch Sai is turned off, discharge from the cell Bi to the load 11 is cut off. The other cells only supply power to the load 11. A voltage produced by the cell Bi disconnected from the load 11 is therefore developed between the voltage detection terminal Tc and the negative terminal T2 of the battery unit 1. The power supply control microcomputer 12 in the main unit judges the state of the cell Bi from the voltage.

The power supply control microcomputer 12 checks the state of the cell Bi, and then outputs a state detection request signal SI to the control circuit 4 so as to check the state of another cell (B(i+1)).

In response to the state detection request signal SI, the control circuit 4 transmits a control signal to the selection switch Sai that has connected the cell Bi to the voltage detection terminal Tc. The control circuit 4 thus instructs the selection switch Sai to connect the cell Bi to the load 11. Moreover, the control circuit 4 transmits a control signal to a selection switch Sa(i+1) and thus instructs the selection switch to connect a cell B(i+1) to the voltage detection terminal Tc.

In the battery unit 1 shown in FIG. 9, when a cell that is an object of inspection is changed to another, the control circuit 4 first changes the destination to which the cell B1 is connected back to the load 11. The control circuit 4 then outputs the control signal, with which the destination to which the cell B2 is connected is changed to the voltage detection terminal Tc, to the selection switch Sa2. When the battery unit is composed of three or more cells, even if the cells Sai and Sa(i+1) were both selecting the voltage detection terminal Tc, power supply to the load would not be discontinued. Even in this embodiment, however, the control circuit 4 first outputs the control signal, with which the destination to which the cell Bi is connected is changed back to the load 11, to the selection switch Sai, and then outputs the control signal, with which the cell B(i+1) is connected to the voltage detection terminal Tc, to the selection switch Sa(i+1). This is intended to lighten the load on the cells or avoid the incident that two cells are connected to the voltage detection terminal Tc.

In response to the control signals, the selection switch Sai connects the cell Bi to the load 11 and the selection switch Sa(i+1) connects the cell B(i+1) to the voltage detection terminal Tc. When the destination to which the cell B(i+1) is connected is changed to the voltage detection terminal Tc, discharge from the cell B(i+1) to the load 11 is cut off. The cell Bi alone supplies power to the load 11. A voltage produced by the cell B(i+1) disconnected from the load 11 is therefore developed between the voltage detection terminal Tc and the negative terminal T2 of the battery unit 1. The power supply control microcomputer 12 in the main unit 10 judges the state of the cell B(i+1) from the voltage.

The selection switches Sai shown in FIG. 14 have the same circuitry as the selection switch Sai shown in FIG. 11. Moreover, the state detection request signal SI output from the power supply control microcomputer to the control circuit 4 is composed of the same number of bits as the number of cells. Depending on the combination of logic levels represented by digits, one cell alone is connected to the voltage detection terminal or all the cells are connected to the load 11.

Figure 15:
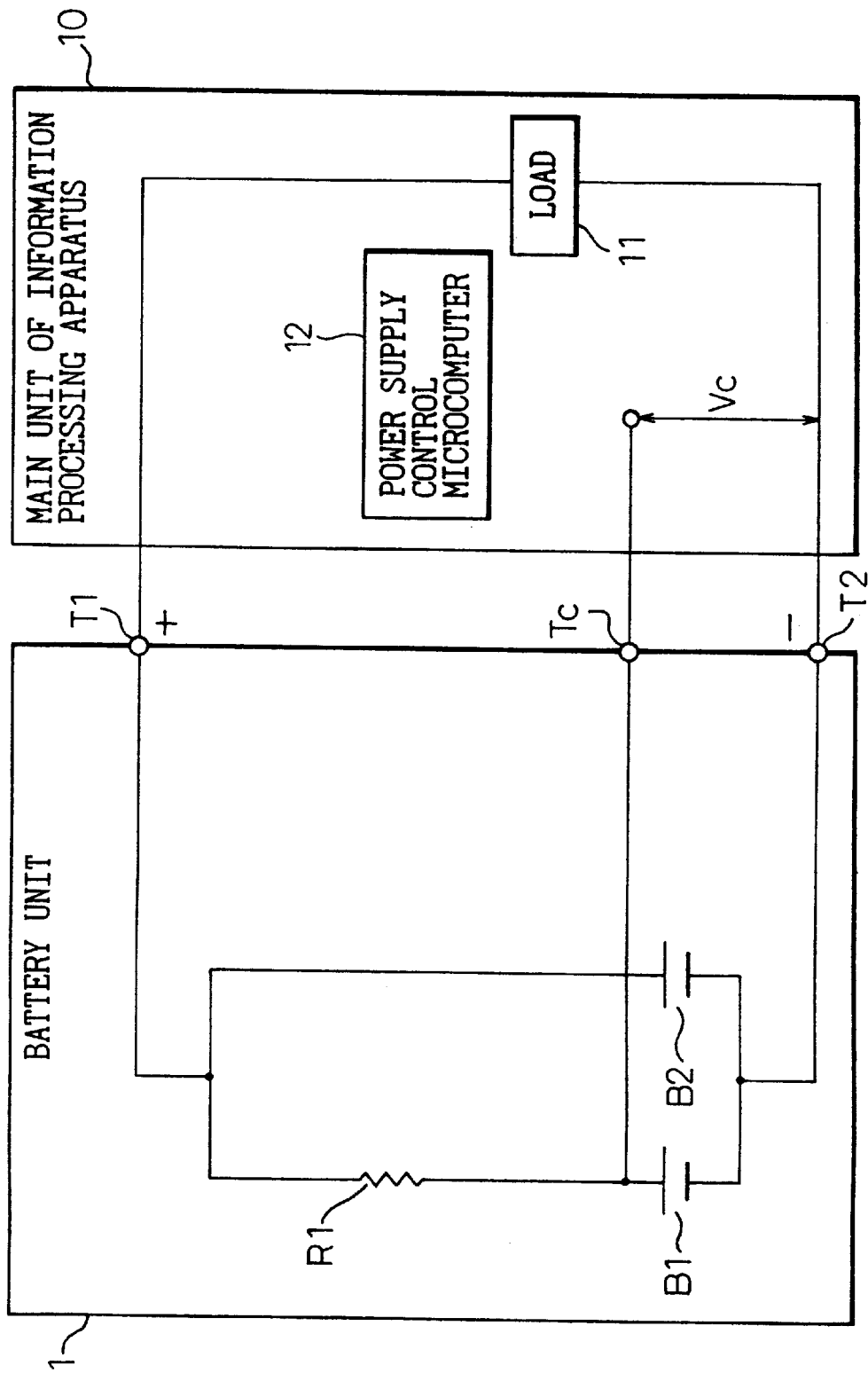
FIG. 15 is a diagram showing the seventh embodiment of the present invention.

FIG. 15 shows a battery unit in accordance with the seventh embodiment of the present invention and a main unit of an information processing apparatus to which the battery unit is attached. In FIG. 1 to FIG. 14, a switch or switches are used to disconnect the cells from the load 11. In FIG. 15, a resistor is substituted for the switch in order to limit a current flowing from the cells to the load 11. Thus, a state similar to a state in which the cells are disconnected from the load is established.

In FIG. 15, there is shown a resistor R1. The resistor R1 is connected in series with the cell B1 in order to limit a current flowing from the cell B1 to the load 11 in the main unit 10. Moreover, the voltage detection terminal Tc is connected only to the cell B1.

The actions of the battery unit shown in FIG. 15 will be described below.

When the battery unit 1 is mounted in the main unit 10, the main unit 10 is inserted between the positive terminal T1 and negative terminal T2 of the battery unit 1. A current flowing from the cell B1 to the load 11 is suppressed by the resistor R1. Power to be supplied to the load 11 is obtained mainly from the cell B2. A voltage nearly equal to a no-load voltage provided by the cell B2 is developed between the voltage detection terminal Tc and one terminal of the battery unit 1. The power supply control microcomputer 12 in the main unit 10 judges the state of the cell B1 from the voltage.

Figure 16:
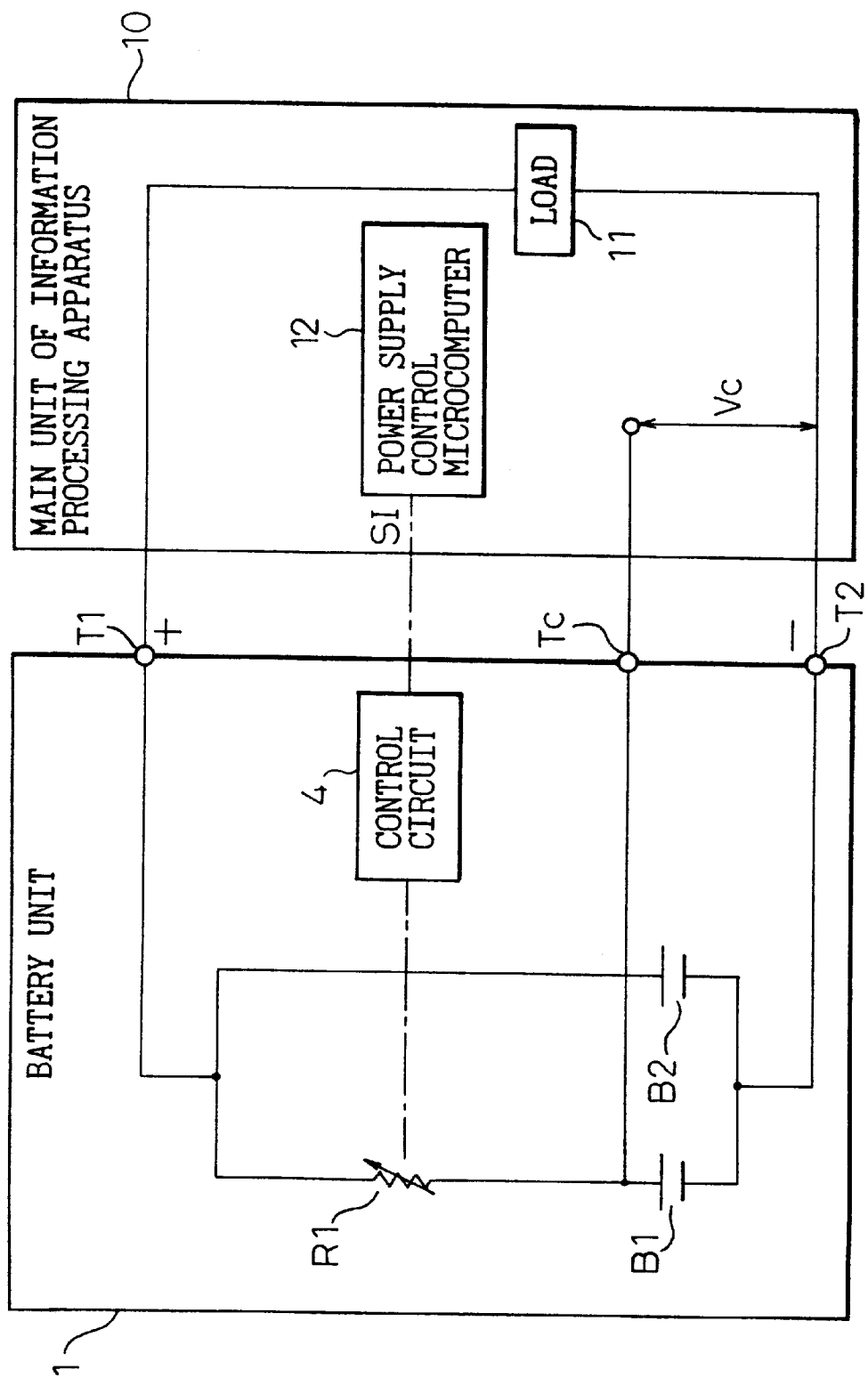
FIG. 16 is a diagram showing the eighth embodiment of the present invention.

FIG. 16 shows a battery unit in accordance with the eighth embodiment of the present invention and a main unit of an information processing apparatus to which the battery unit is attached. In FIG. 16, the resistor R1 in FIG. 15 is realized with a variable resistor. The control circuit 4 is incorporated in the battery unit in order to control a resistance offered by the resistor R1.

The actions of the battery unit shown in FIG. 16 will be described below.

When it is unnecessary to detect the state of the cell B1, the control circuit 4 sets the resistance to be offered by the resistor R1 to 0 Ω or an equivalent value in response to an instruction sent from the power supply control microcomputer. The cell B1 and cell B2 both supply power to the load 11.

In the foregoing state, the power supply control microcomputer 12 issues a state detection request SI to the control circuit 4. In response to the request, the control circuit 4 sets the resistance to be offered by the resistor R1 to a large value (approximately 100 MΩ).

As the resistance offered by the resistor R1 increases, a current flowing from the cell B1 to the load 11 is suppressed. Power supplied to the load 11 is mainly obtained from the cell B2. A voltage nearly equal to a no-load voltage provided by the cell B2 is developed between the voltage detection terminal Tc and one terminal of the battery unit 1. The power supply control microcomputer 12 in the main unit 10 judges the state of the cell B1 from the voltage.

Figure 17:
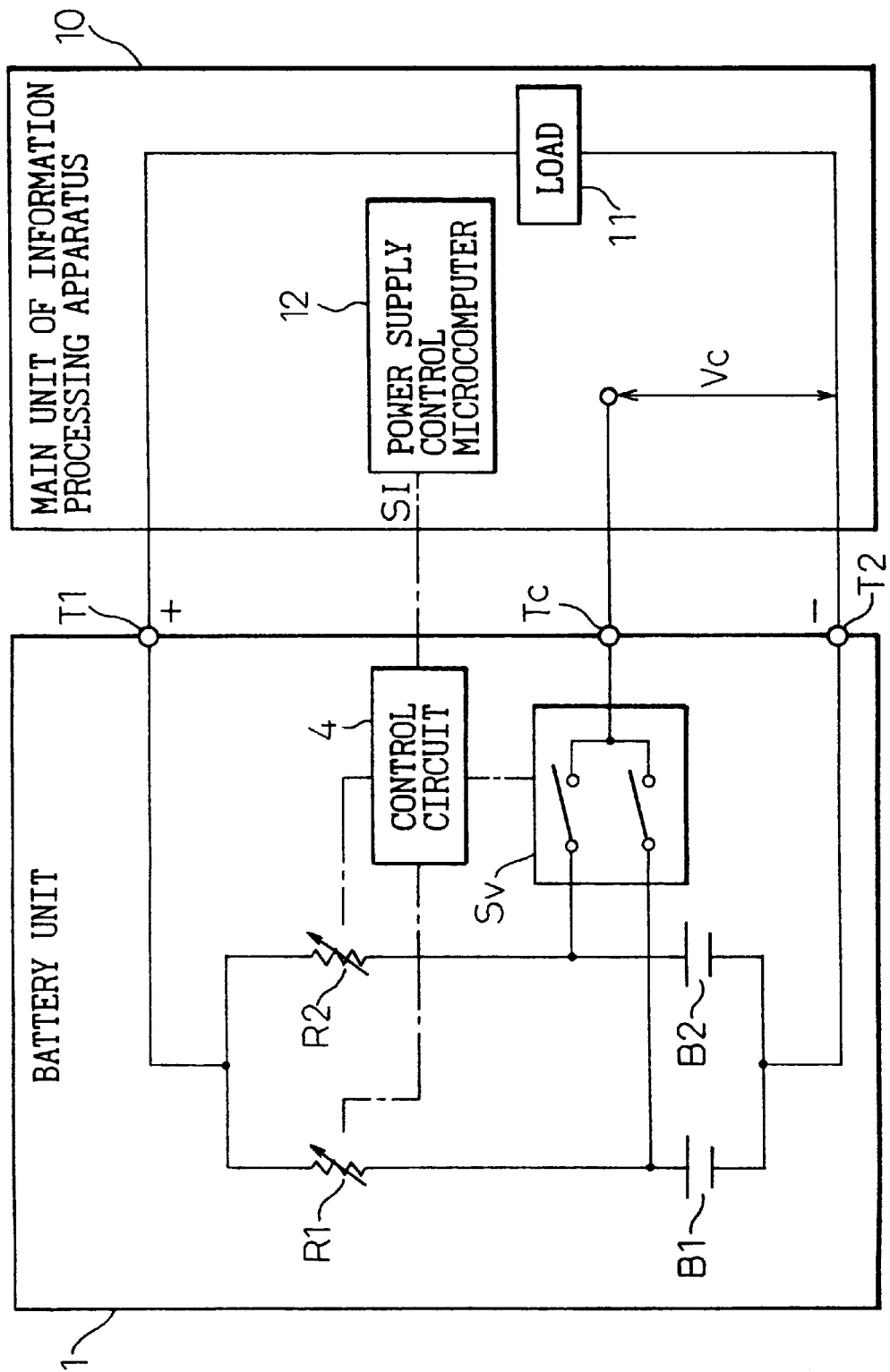
FIG. 17 is a diagram showing the ninth embodiment of the present invention.

FIG. 17 shows a battery unit in accordance with the ninth embodiment of the present invention and a main unit of an information processing apparatus to which the battery unit is attached. The battery unit shown in FIG. 17 is designed to to be able to detect the state of the cell B2 as in the battery unit shown in FIG. 16.

In FIG. 17, there is shown a resistor R2 connected in series with the cell B2. A selecting circuit Sv selects a cell to be connected to the voltage detection terminal Tc in response to a selection signal sent from the control circuit 4.

The actions of the battery unit shown in FIG. 17 will be described below.

When it is unnecessary to detect the state of the cell B1, the control circuit 4 sets the resistance to be offered by the resistors R1 and R2 to 0 Ω or an equivalent value. The cell B1 and cell B2 both supply power to the load 11.

In this state, the power supply control microcomputer 12 issues a state detection request SI to the control circuit 4. In response to the request, the control circuit 4 transmits a setting signal with which the resistance to be offered by the resistor R1 is set to a large value (approximately 100 MΩ). Moreover, the control circuit 4 transmits a selection signal, with which the cell B1 is selected as a cell to be connected to the voltage detection terminal Tc, to the selecting circuit Sv.

As the resistance offered by the resistor R1 increases, discharge from the cell B1 to the load 11 is suppressed. The load 11 is powered almost entirely by the cell B2. Moreover, the selecting circuit Sv connects the cell B1 to the voltage detection terminal Tc in response to the selection signal. A voltage nearly equal to a no-load voltage provided by the cell B1 is developed between the voltage detection terminal Tc and the negative terminal T2 of the battery unit 1. The power supply control microcomputer 12 in the main unit 10 judges the state of the cell B1 from the voltage Vc.

The power supply control microcomputer checks the state of the cell B1. Thereafter, the power supply control microcomputer issues a state detection request SI to the control circuit 4 so as to check the state of another cell.

In response to the state detection request signal SI, the control circuit 4 outputs a setting signal with which the resistor R1 offering a high resistance is set back to a low resistance (0 Ω or equivalent value). The control circuit 4 outputs a setting signal with which the resistance to be offered by the resistor S2 is set to a large value (approximately 100 MΩ). Moreover, the control circuit 4 transmits a selection signal, with which the cell B2 is selected as a cell to be connected to the voltage detection terminal Tc, to the selecting circuit Sv. If the signal used to set the resistor R2 to the high resistance were transmitted earlier than the signal used to set the resistor R1 to the low resistance, a time zone during which almost no power is supplied to the load would be created. The control circuit 4 therefore operates to first transmit the signal used to set the resistor R1 back to the low resistance and then transmit the signal used to set the resistor R2 to the high resistance.

As the resistance offered by the resistor R2 increases, discharge from the cell B2 to the load 11 is suppressed. The load 11 is powered almost entirely by the cell B1. Moreover, the selecting circuit Sv connects the cell B2 to the voltage detection terminal Tc in response to the selection signal. A voltage nearly equal to a no-load voltage provided by the cell B2 is therefore developed between the voltage detection terminal Tc and the negative terminal T2 of the battery unit 1. The power supply control microcomputer 12 in the main unit 10 judges the state of the cell B2 from the voltage Vc.

In the aforesaid battery units shown in FIG. 1 to FIG. 17, discharge from an individual cell to the load is cut off or suppressed so that a released voltage can be detected in units of a cell. In addition, deterioration of an internal resistor can be detected in units of a cell.

Figure 18:
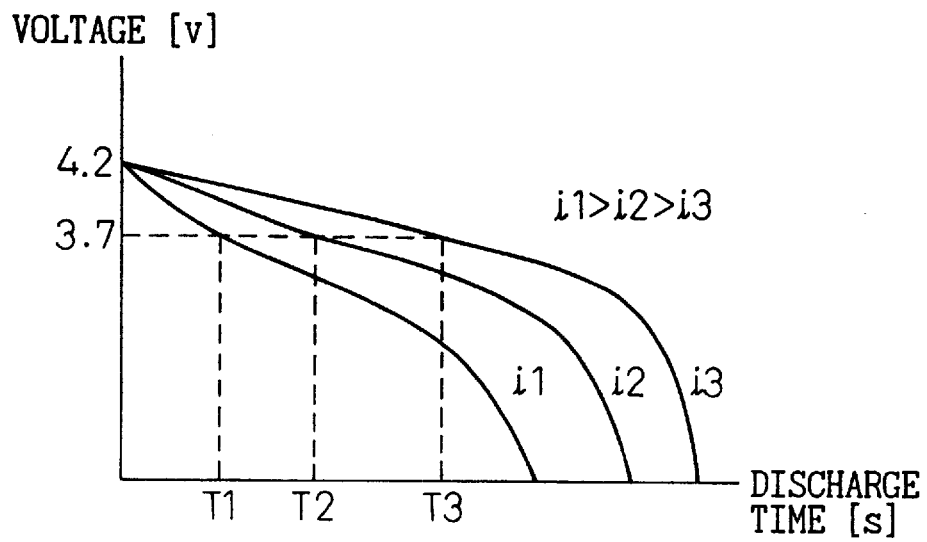
FIG. 18 is a graph showing the relationship between a discharge time and a voltage produced by a cell.

FIG. 18 is a graph indicating the relationship between a discharge time and a voltage produced by a cell.

As seen from FIG. 18, a voltage produced by a cell decreases with the passage of a discharge time. Moreover, the larger a discharge current is, the quicker a drop in cell voltage is. This means that when an internal resistor of a cell has deteriorated, the cell discharges to release a larger current than in a normal state. The voltage drops more quickly.

The present invention proposes an idea that: the cells in the battery unit shown in any of FIG. 1 to FIG. 17 are discharged independently; and deterioration of an internal resistor of each cell is judged from the rate of drop in voltage.

Figure 19:
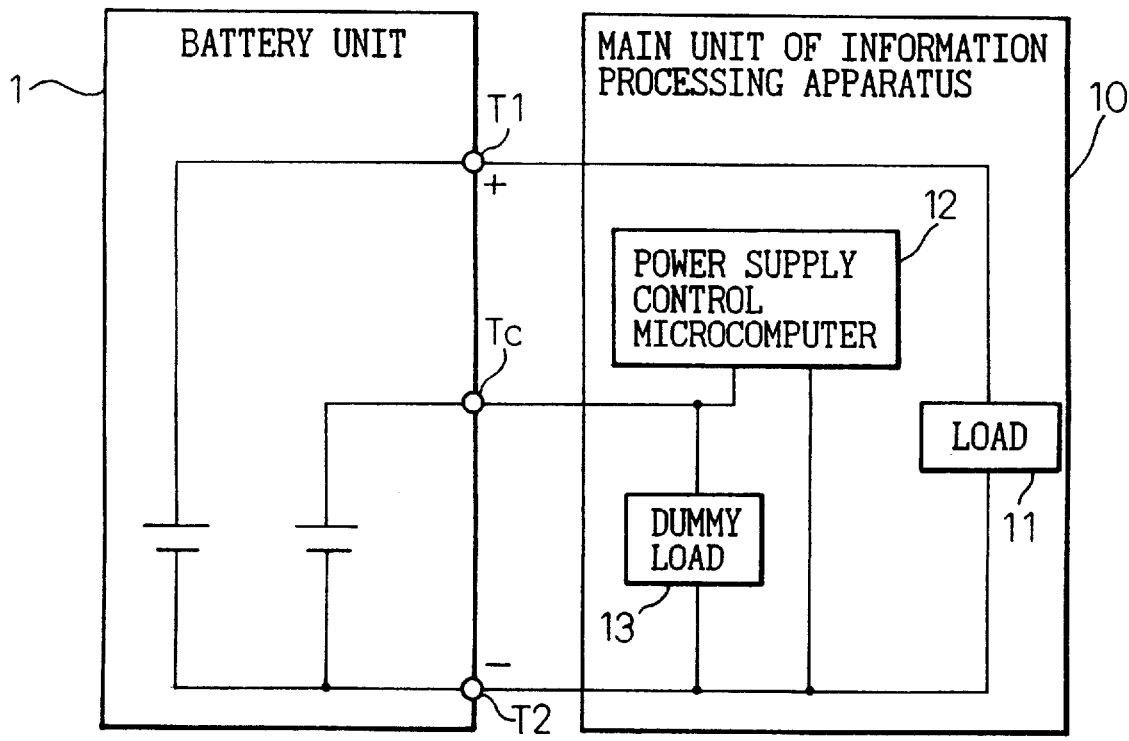
FIG. 19 is a diagram showing the circuitry for detecting deterioration of an internal resistor.

FIG. 19 shows a configuration for judging deterioration of an internal resistor of a cell. A dummy load 13 is connected between the voltage detection terminal Tc and the negative terminal T2 of the battery unit. The dummy load 13 a resistor artificially included as the load 11 in the main unit 10. The dummy load 13 may be a variable resistor.

Detecting deterioration of an internal resistor will be described below.

First, similarly to measurement of a no-load voltage, the control circuit 4 operates the switch and the selecting circuit so as to stop a supply of power from any one cell to the load (in the battery units shown in FIG. 1 and FIG. 17, supply of power to the load is suppressed by increasing a resistance). The control circuit 4 controls the selecting circuit Sv and connects the cell to the voltage detection terminal Tc.

The one selected cell discharges towards the dummy load 13. The voltage produced by the cell drops gradually. The power supply control microcomputer 12 monitors the voltage produced by the cell to check if the time required for the voltage to reach a pre-set value is shorter than a reference time. The reference time is set according to a resistance offered by the dummy load 13. If the resistance is low, the reference time is made short. If the resistance is high, the reference time is made long. Moreover, the resistance to be offered by the dummy load 13 may not be set to a fixed value but may be varied under the control of the power supply control microcomputer 12. For detecting deterioration of an internal resistor of a cell included in a battery unit shown in any of FIG. 15 to FIG. 17, a resistance to be offered by a resistor connected to the cell to be inspected must be set to a value that is much larger than the resistance of the dummy load 13.

The configurations of the battery units in accordance with the present invention have been described. Next, the configuration of a main unit of a system in which any of the battery units is mounted will be described.

Figure 20:
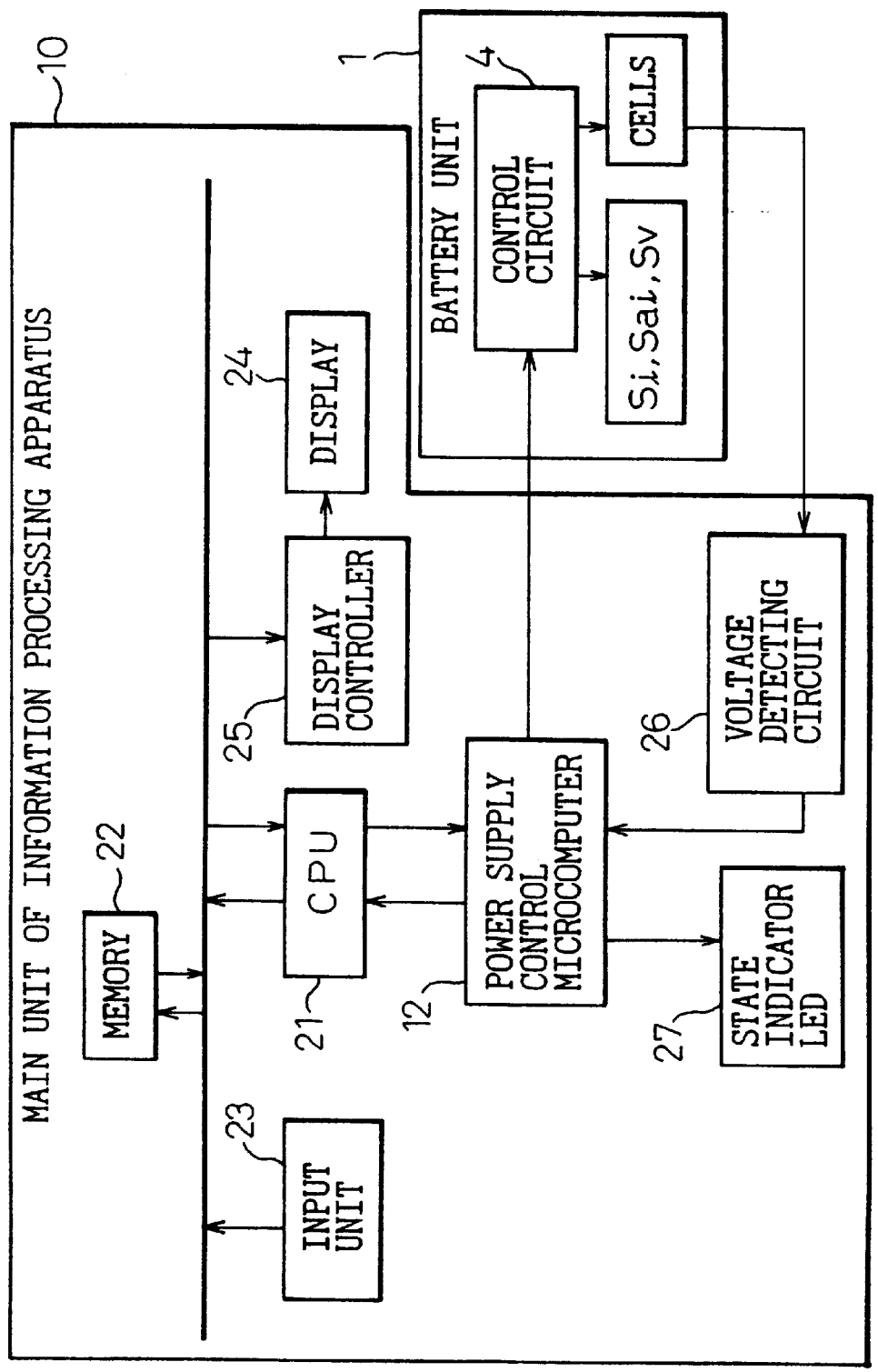
FIG. 20 is a diagram showing the configuration of a main unit of an information processing apparatus in which a battery unit is mounted.

FIG. 20 is a block diagram showing a power supply control system in a main unit 10.

In FIG. 20, there are shown a CPU 21 in the main unit, a main memory 22 in the main unit, and an input unit 23 such as a keyboard or mouse. A display 24 such as an LCD displays video information or character information. A display controller 25 allows the display 24 to display information according to an instruction sent from the CPU 21. A detecting circuit 26 detects a voltage Vc developed at a terminal Tc of a battery unit 1. An LED 27 glows to indicate that an amount of power remaining in the battery unit has become insufficient.

The actions of a system shown in FIG. 20 will be described below.

When the main power switch of the main unit of the system is turned on, the power supply control microcomputer 12 executes a given power supply control sequence. Assume that an AC voltage is supplied normally from the mains and power stemming from the AC voltage is supplied to the respective components of the main unit. In this state, while power is supplied from the AC mains, the battery unit is charged via a charger.

Figure 21A:
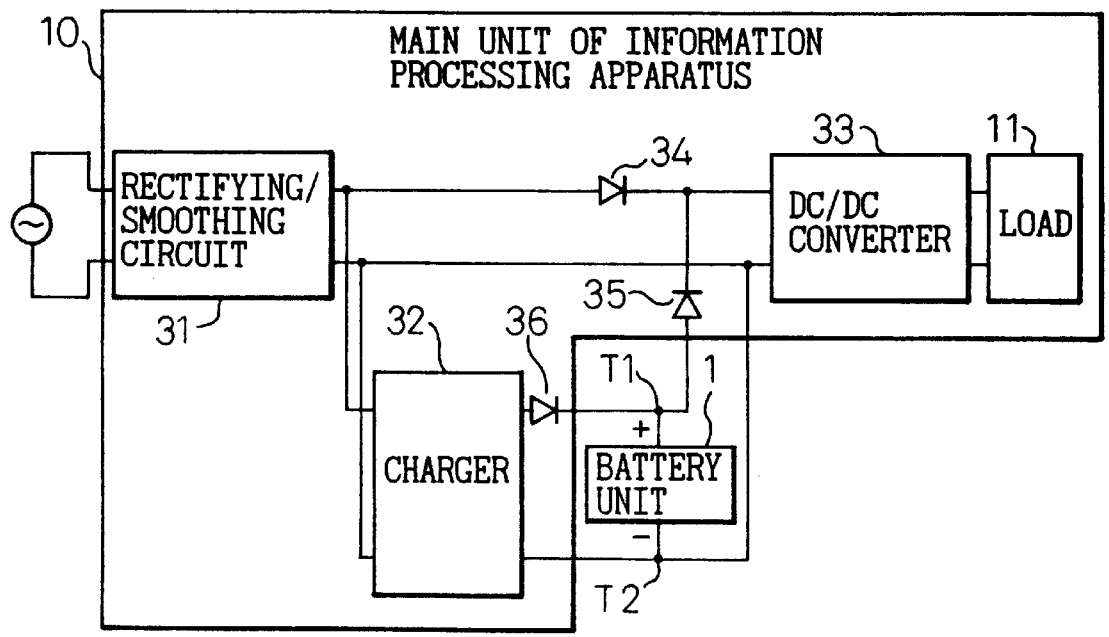
FIG. 21A is a block diagram showing a power supply system.
Figure 21B:
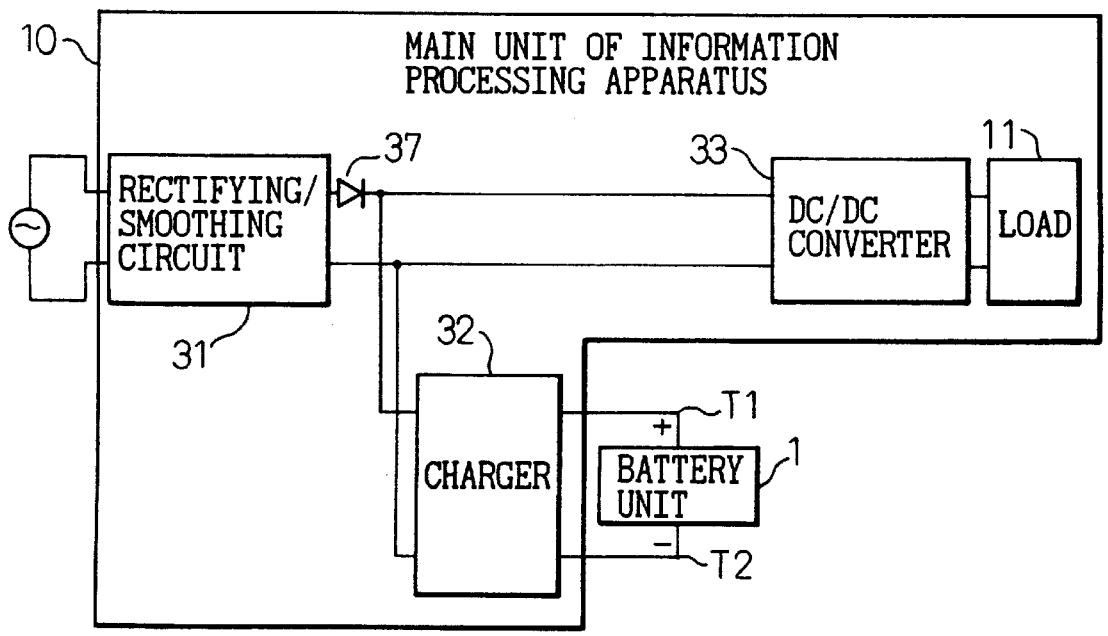
FIG. 21B is a block diagram showing another embodiment of a power supply system.

FIGS. 21A and FIG. 21B are block diagrams showing a power supply system for the main unit.

In FIGS. 21A and FIG. 21B, there are shown a rectifying/smoothing circuit 31 for rectifying and smoothing an ac input voltage, a charger 32 for charging the battery unit using an output of the rectifying/smoothing circuit, and a dc-to-dc converter 33 for converting a rectified and smoothed input into a voltage required by a load. In FIGS. 21A and 21B, diodes 34 to 37 prevent reverse flow.

As long as ac power is supplied normally, an output voltage of the rectifying/smoothing circuit is higher than that of the battery unit. The diode 35 in FIG. 21A is turned off. The battery unit 1 will not be discharged but be charged by the charger 32.

When ac power becomes abnormal (fails or drops), an output voltage of the battery unit becomes higher than that of the rectifying/smoothing circuit 31. The diode 34 in FIG. 21A and the diode 37 in FIG. 21B are turned off. The battery unit 1 starts discharging towards the load 11.

When the battery unit starts discharging, the power supply control microcomputer 12 transmits a control signal SI to the control circuit 4 in the battery unit 1 so as to check the state of the battery unit. The power supply control microcomputer 12 thus requests transmission of an output of a cell in the battery unit 1. The power supply control microcomputer 12 designates a cell to be inspected by combining bits that constitute the control signal SI.

In the battery unit, the control circuit 4 transmits a control signal to each switch in response to the control signal SI. The control circuit 4 then transmits an output of a designated cell to the main unit 10 through the voltage detection terminal Tc.

In the main unit 10, the voltage detecting circuit 26 checks the designated cell to see if a voltage produced by the cell is lower than a given voltage. If it is detected that the voltage is lower than the given voltage, an alarm is sent to the power supply control microcomputer 12.

Figure 22:
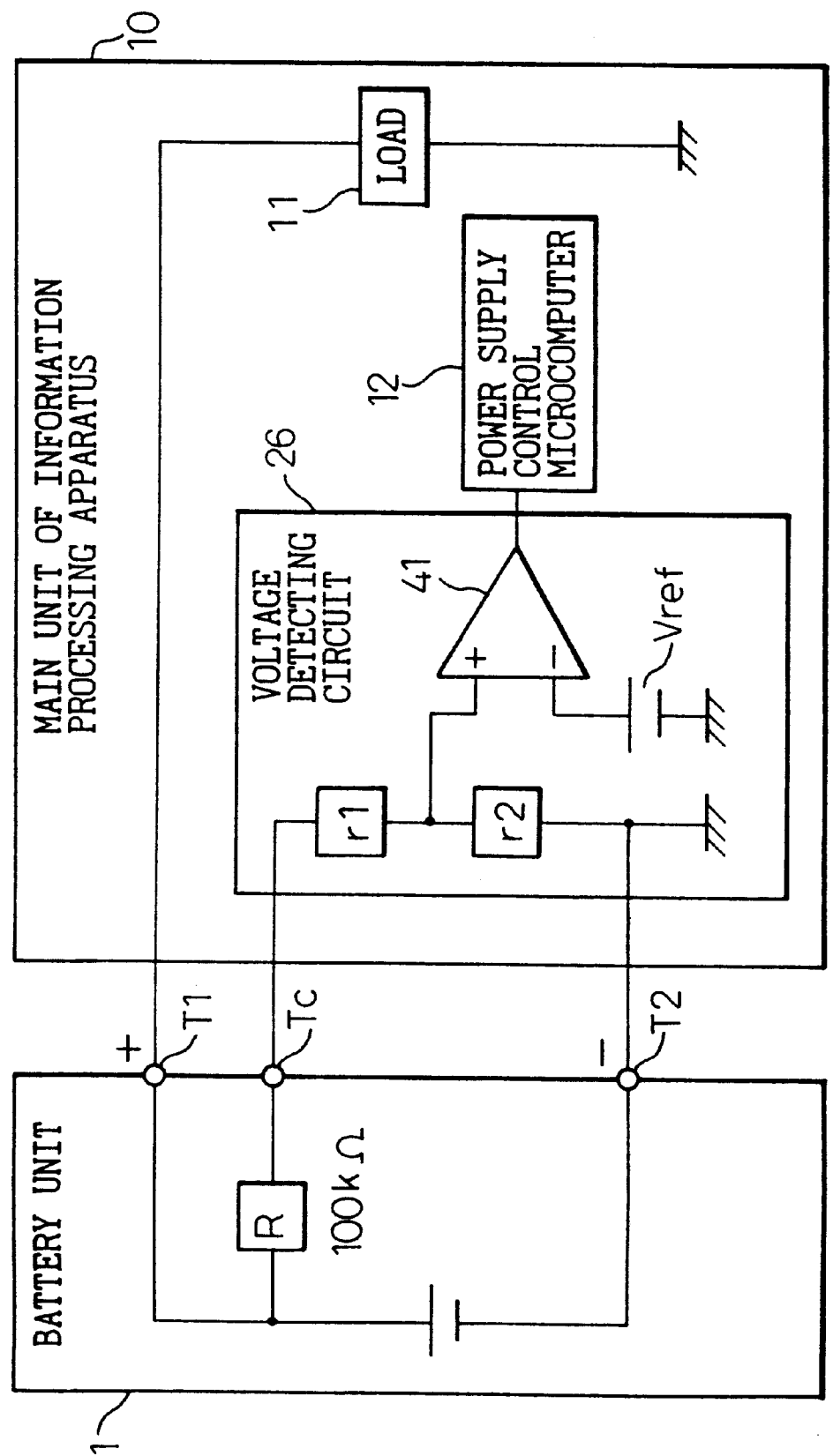
FIG. 22 is a diagram showing a voltage detecting circuit.

FIG. 22 shows an example of the voltage detecting circuit 26.

In FIG. 22, there is shown a comparator 41. The comparator 41 inputs a fraction of a voltage produced by a cell, which is produced by resistors r1 and r2, through a negative terminal thereof, and inputs a reference voltage Vref through a positive terminal thereof. The comparator 41 identifies the size of the cell voltage. If a voltage developed at a node between the resistors r1 and r2 is higher than the reference voltage Vref, it is judged that the cell voltage or the voltage produced by the cell falls within a specified range. A low-level signal is then output to the power supply control microcomputer 12. In contrast, when the voltage at the node between the resistors r1 and r2 is lower than the reference voltage Vref, it is judged that the cell voltage has not reached the specified value. A high-level signal is output as an alarm signal to the power supply control microcomputer 12.

The power supply control microcomputer 12 monitors a detection signal produced by the voltage detecting circuit 25. After checking if the cell is abnormal, the power supply control microcomputer 12 transmits a state detection request signal SI to the control circuit 4 in the battery unit 1 so as to check the state of another cell whose state has not been checked. Moreover, when identifying an abnormal cell by detecting an alarm signal, the power supply control microcomputer 12 notifies the CPU 21 of the fact and allows the state indicator LED to glow. In the power supply control microcomputer 12, the relationship of correspondence between a bit stream constituting the state detection request signal SI and a cell to be inspected is stored therein. The power supply control microcomputer 12 can therefore recognize with which cell the alarm signal is concerned. If the storage capacity of the memory 22 is large enough, information indicating which cell is abnormal can be stored in the memory 22.

The CPU 21 instructs the display controller 24 to output an alarm indication on the display 23, thus informing an operator of an abnormality occurring in a cell. Moreover, if information indicating a cell in which an abnormality has occurred is stored in the memory 22, information indicating which cell is abnormal can also be output.

The power supply control microcomputer 12 may operate to detect the state of each cell in the battery unit 1 once during a cell driving period or to detect the state of each cell cyclically. Moreover, the power supply control microcomputer 12 may operate not to connect a cell, which is found to be abnormal, to the load 11. By disconnecting an abnormal cell from the load, outflow of energy from a normal cell to an abnormal cell can be prevented. A discharge time can be extended. Moreover, inflow of a charge current to an abnormal cell can be prevented. A charge time can be shortened.

As described so far, the present invention provides a configuration making it possible to disconnect individual cells in a battery unit from a load. The state of the battery unit can be detected with high precision while being unaffected by a variation in load current. Moreover, since each cell can be disconnected from the load, a voltage produced by a cell can be detected in units of a cell. The state of the battery unit can be checked in more detail.

What is claimed is:

1. A battery unit, comprising:
   a plurality of cells connected in parallel with one another;
   a switch connected in series with at least one of said cells: and
   a control circuit for controlling the on or off state of said switch.

2. A battery unit according to claim 1, further comprising a voltage detection terminal at which a voltage produced by a cell is developed.

3. A battery unit according to claim 2, wherein said voltage detection terminal is connected between said switch and cells.

4. A battery unit according to claim 2, wherein said switch connects said cells to one of said load and said voltage detection terminal.

5. A battery unit according to claim 4, wherein said control circuit controls said switch in response to an external control signal so that any one of said cells will be connected to said voltage detection terminal.

6. A battery unit according to claim 2, wherein said control circuit turns off said switch in response to an external control signal.

7. A battery unit according to claim 1, wherein said control circuit turns off said switch in response to an external control signal.

8. A battery unit according to claim 7, further comprising a selecting circuit, interposed between said voltage detection terminal and said cells to be connected to said voltage detection terminal, for selecting a cell to be connected to said voltage detection terminal.

9. A battery unit according to claim 8, wherein said control circuit controls said selecting circuit in response to an external control signal.

10. A battery unit according to claim 9, wherein said control circuit controls said selecting circuit so that a cell connected to a switch that is off will be selected.

11. A battery unit, comprising:
    a plurality of cells connected in parallel with one another;
    a variable resistor connected in series with at least one of said cells; and
    a control circuit for controlling a resistance to be offered be said variable resistor.

12. A battery unit according to claim 11, further comprising a voltage detection terminal connected to at least one of said cells, and at which a voltage produced by the cell is developed.

13. A battery unit according to claim 12, wherein said control circuit makes a resistance, which is to be offered by any one of variable resistors, larger than that to be offered by the other variable resistors in response to an external control signal.

14. A battery unit according to claim 13, further comprising a switch, interposed between said voltage detection terminal and said cells sharing said voltage detection terminal, for selecting a cell to be connected to said voltage detection terminal.

15. A battery unit according to claim 14, wherein said control circuit operates said switch in response to an external control signal.

16. A battery unit according to claim 15, wherein said control circuit operates said switch so that a cell connected to a resistor, which is set to a maximum resistance, will be selected.

17. An information processing apparatus, comprising:
    a main unit;
    a battery unit having a plurality of cells connected in parallel with one another and a switch connected in series with at least one of said cells, and supplying power to said main unit when detachably attached to said main unit;
    a power supply control circuit, incorporated in said main unit, for designating any one of said plurality of cells and requesting said battery unit to notify it of the state of the cell; and
    a state detection terminal included in said battery unit and used to detect the state of the cell designated by said power supply control circuit.

18. A method of checking the state of a battery unit having a plurality of cells connected in parallel with one another and supplying power to a load, comprising the step of:
    disconnecting said cells from said load one by one, and detecting a voltage produced by a cell disconnected from said load.

19. A method according to claim 18, further comprising a step of disconnecting a cell, in which an abnormality has been detected at said step of detecting a voltage produced by a cell, from said load, and supplying power from said battery unit to said load.

* * * * *